US006251723B1

(12) United States Patent
Takaishi

(10) Patent No.: US 6,251,723 B1
(45) Date of Patent: Jun. 26, 2001

(54) METHOD FOR MANUFACTURING SEMICONDUCTOR MEMORY DEVICE CAPABLE OF IMPROVING ISOLATION CHARACTERISTICS

(75) Inventor: Yoshihiro Takaishi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/411,236

(22) Filed: Oct. 4, 1999

(30) Foreign Application Priority Data

Oct. 5, 1998 (JP) .................................................. 10-282555

(51) Int. Cl.[7] ...................... H01L 21/8242; H01L 21/28; H01L 21/768
(52) U.S. Cl. .......................... 438/253; 438/669; 257/315; 257/774
(58) Field of Search .................................. 438/669, 670, 438/671, 253; 257/315, 774

(56) References Cited

U.S. PATENT DOCUMENTS 5,545,588 * 8/1996 Yoo ........................................ 438/671
5,677,225 * 10/1997 Park ...................................... 438/253
5,972,747 * 10/1999 Hong ..................................... 438/253

FOREIGN PATENT DOCUMENTS

| 4-350928 | 12/1992 | (JP) . |
| 9-8254 | 1/1997 | (JP) . |
| 9-97882 | 4/1997 | (JP) . |
| 10-50829 | 2/1998 | (JP) . |

OTHER PUBLICATIONS

Japanese Office Action dated Nov. 14, 2000, with partial English translation.

* cited by examiner

Primary Examiner—Charles Bowers
Assistant Examiner—David S Blum
(74) Attorney, Agent, or Firm—McGinn & Gibb, PLLC

(57) ABSTRACT

In a method for manufacturing a semiconductor memory device, a plurality of openings are perforated in an insulating layer formed on first impurity diffusion regions for bit lines and second impurity diffusion regions for capacitors of a semiconductor substrate surrounded by a field insulating layer, and each of the openings corresponds to one of the first impurity diffusion regions and at least two of the second impurity diffusion regions.

12 Claims, 46 Drawing Sheets

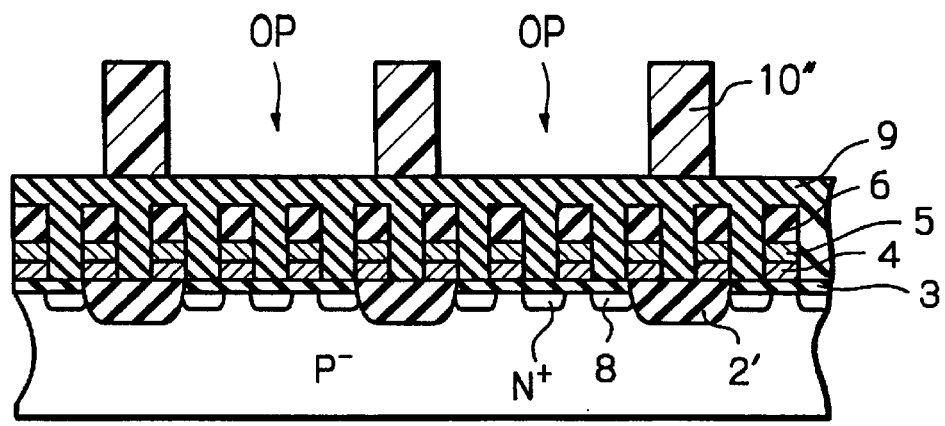
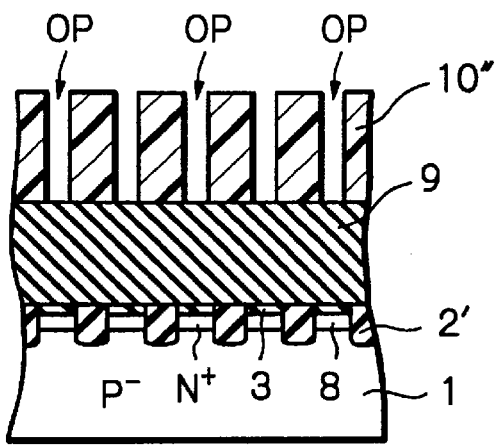
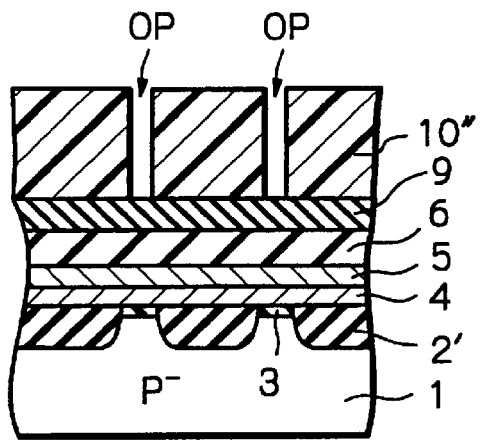
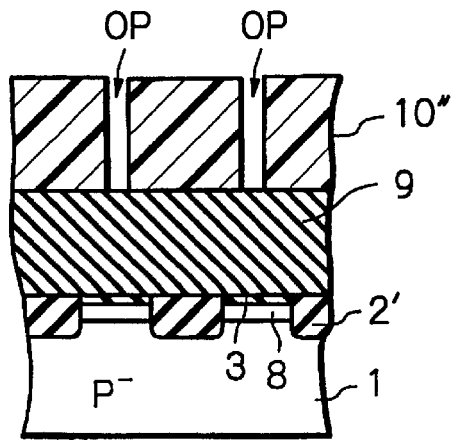

METHOD FOR MANUFACTURING SEMICONDUCTOR MEMORY DEVICE CAPABLE OF IMPROVING ISOLATION CHARACTERISTICS

BACKGROUND OF THE INVENTION

1. Field of the Invention

The present invention relates to a method for manufacturing a semiconductor memory device, and more particularly, to the improvement of the isolation characteristics of a dynamic random access memory (DRAM) device.

2. Description of the Related Art

Recently, as DRAM devices have become more fine-structured, openings such as contact holes have also become more fine-structured. On the other hand, in order to increase the integration, as technology for forming a field insulating layer, a shallow trench isolation (STI) process has been adopted instead of a local oxidation of silicon (LOCOS) process.

In a prior art method for manufacturing a DRAM device, a plurality of openings are perforated in an insulating layer formed on first impurity diffusion regions for bit lines and second impurity diffusion regions for capacitors surrounded by a field insulating layer of a semiconductor substrate, and each of the openings corresponds to one of the impurity diffusion regions. This will be explained later in detail.

In the above-described prior art method, since each opening corresponds to one of the impurity diffusion regions, the sides of the field insulating layer may be etched, which would deteriorate the isolation characteristics. Particularly, if a field insulating layer is formed by an STI process so that the sides of the field insulating layer are sharp, the isolation characteristics would remarkably deteriorate. Also, since the size of contact structures, i.e., pad electrodes buried in the openings is decreased, the contact resistance is increased.

SUMMARY OF THE INVENTION

It is an object of the present invention to provide a method for manufacturing a DRAM device capable of improving the isolation characteristics.

Another object is to decrease the contact resistance of a contact structure in the DRAM device.

According to the present invention, in a method for manufacturing a semiconductor memory device, a plurality of openings are perforated in an insulating layer formed on first impurity diffusion regions for bit lines and second impurity diffusion regions for capacitors of a semiconductor substrate surrounded by a field insulating layer, and each of the openings corresponds to one of the first impurity diffusion regions and at least two of the second impurity diffusion regions.

Thus, the photolithography process for forming the openings is easily carried out, so that the side etching of the field insulating layer can be avoided. Also, the size of the pad electrodes buried in the openings can be increased.

BRIEF DESCRIPTION OF THE DRAWINGS

The present invention will be more clearly understood from the description set forth below, as compared with the prior art, with reference to the accompanying drawings, wherein:

FIGS. 32A, 32B, 32C, 32D, 33A, 33B, 33C, 33D, 34A, 34B, 34C, 34D, 35A, 35B, 35C, 35D, 36A, 36B, 36C, 36D, 37A, 37B, 37C, 37D, 38A, 38B, 38C, 38D, 39A, 39B, 39C, 39D, 40A, 40B, 40C, 40D, 41A, 41B, 41C, 41D, 42A, 42B, 42C, 42D and 43 are cross-sectional views for explaining a second embodiment of the method for manufacturing a DRAM device according to the present invention;

DESCRIPTION OF THE PREFERRED EMBODIMENTS

Before the description of the preferred embodiments, a prior art method for manufacturing a DRAM device will be explained with reference to FIGS. 1A, 1B, 1C, 2A, 2B, 2C, 3A, 3B, 3C, 4A, 4B, 4C, 5A, 5B, 5C, 6A, 6B, 6C, 7A, 7B, 7C, 8A, 8B, 8C, 9A, 9B, 9C, 10A, 10B, 10C, 11A, 11B, 11C, 12A, 12B, 12C, 13, 14, 15 and 16.

Figure 1A:
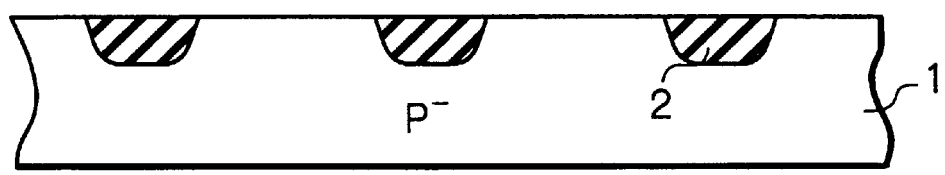
FIGS. 1A, 1B, 1C, 2A, 2B, 2C, 3A, 3B, 3C, 4A, 4B, 4C, 5A, 5B, 5C, 6A, 6B, 6C, 7A, 7B, 7C, 8A, 8B, 8C, 9A, 9B, 9C, 10A, 10B, 10C, 11A, 11B, 11C, 12A, 12B, 12C and 13 are cross-sectional views for explaining a prior art method for manufacturing a DRAM device.
Figure 1B:
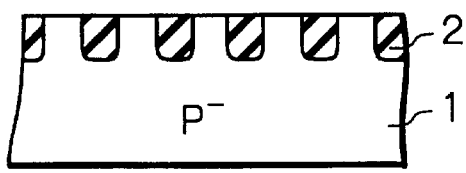
Figure 1C:
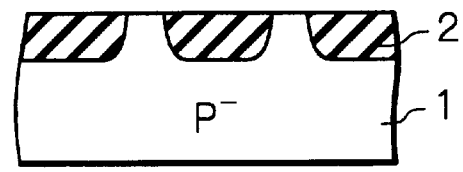
Figure 14:
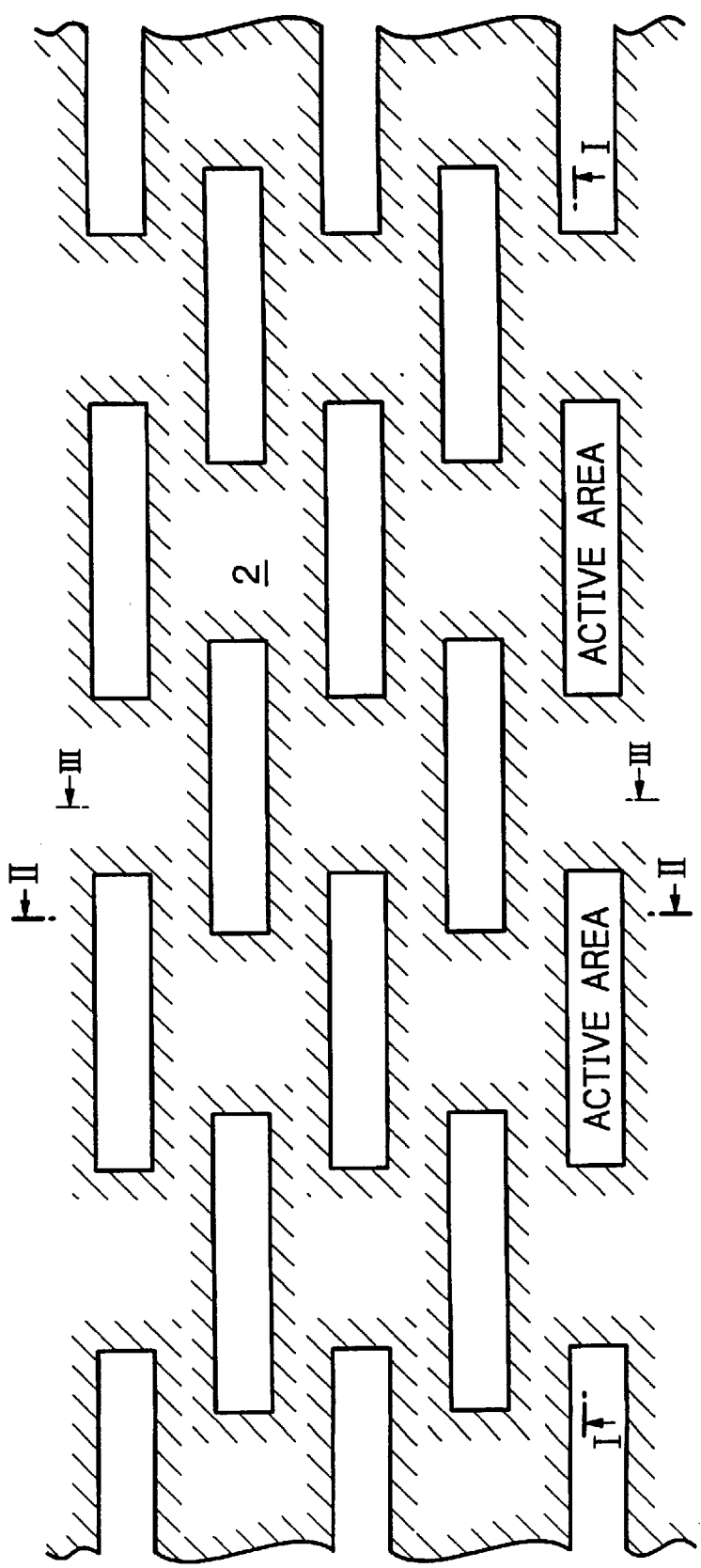
FIG. 14 is a plan view of the field silicon oxide layer of FIGS. 1A, 1B and 1C.

First, referring to FIGS. 1A, 1B and 1C, a field silicon oxide layer 2 as illustrated in FIG. 14 is formed on a P-type monocrystalline silicon substrate 1 by a shallow trench isolation (STI) process. Note that the STI process includes the steps of forming a silicon nitride pattern on the silicon substrate 1, etching the silicon substrate 1 by using the silicon nitride pattern (not shown) as a mask, depositing a silicon oxide layer on the entire surface by a chemical vapor deposition (CVD) process, and performing a chemical mechanical polishing (CMP) process upon the silicon oxide layer and the silicon nitride layer to obtain the field silicon oxide layer 2.

Note that FIGS. 1A, 1B and 1C are cross-sectional views taken along the lines I—I, II—II and III—III, respectively, of FIG. 14 which is a plan view of the field silicon oxide layer 2. Note that the field silicon oxide layer 2 defines a field area surrounding active areas.

Figure 2A:
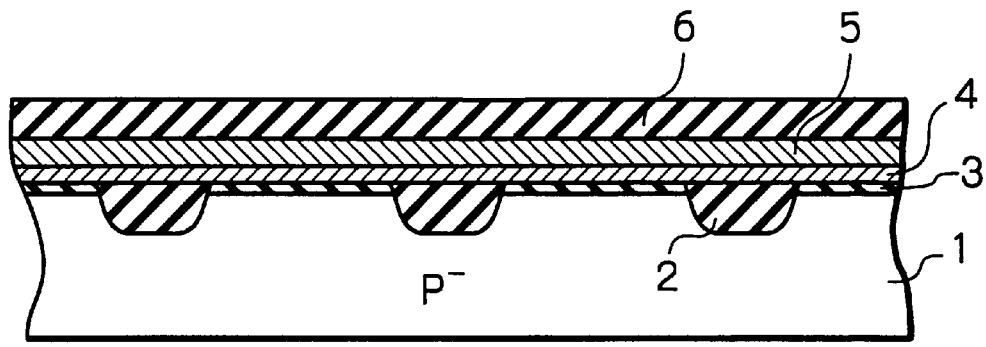
Figure 2B:
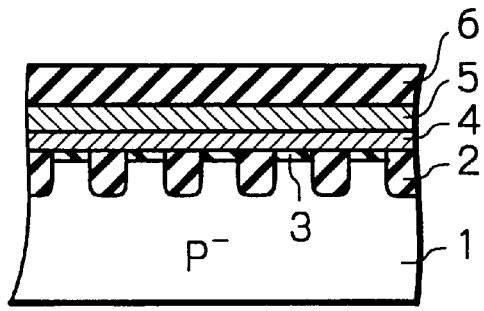
Figure 2C:
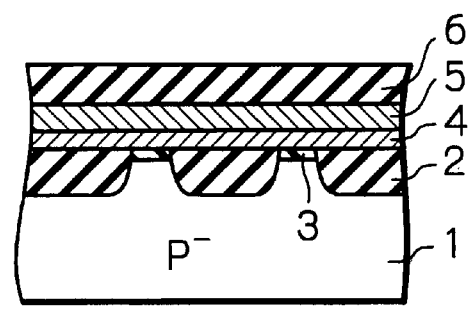

Next, referring to FIGS. 2A, 2B and 2C, a gate silicon oxide layer 3 is thermally grown on the silicon substrate 1. Then, an about 100 nm thick lower gate electrode layer 4 made of polycrystalline silicon and an about 150 nm thick upper gate electrode layer 5 made of silicon silicide such as WSi are deposited by a CVD process or a sputtering process. Then, an about 150 nm thick silicon nitride layer 6 serving as an etching stopper is deposited on the upper gate electrode 5 by a CVD process.

Figure 3A:
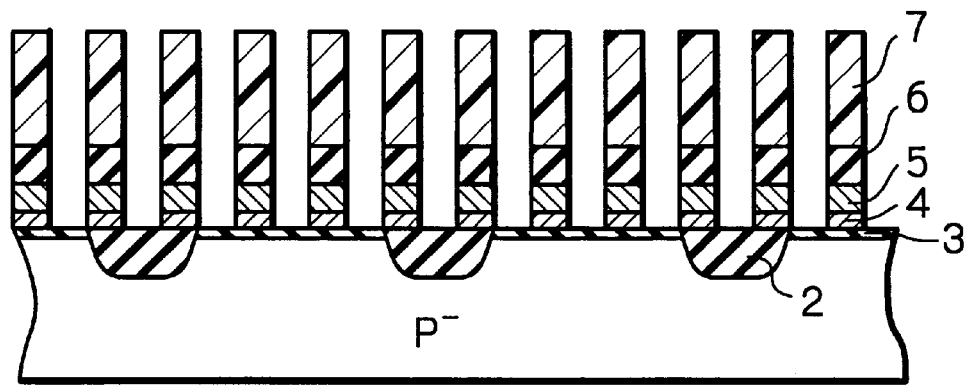
Figure 3B:
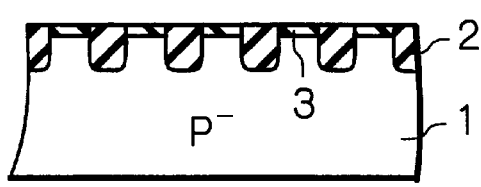
Figure 3C:
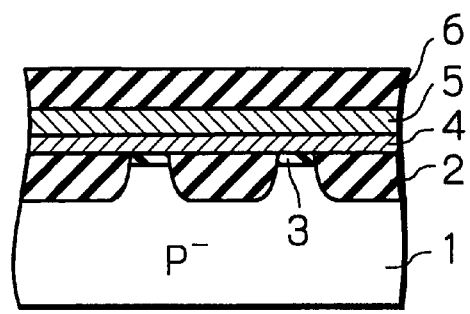
Figure 15:
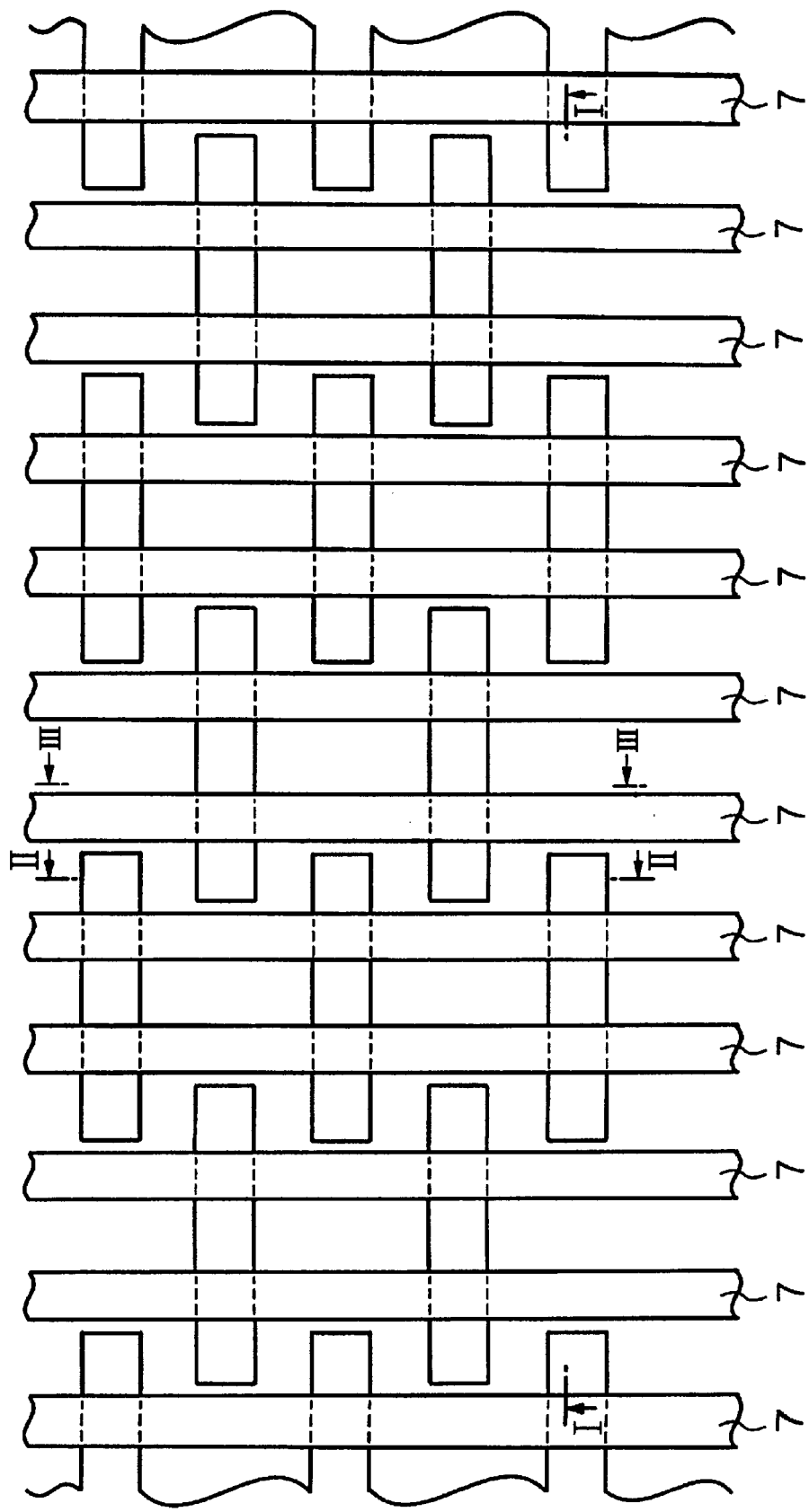
FIG. 15 is a plan view of the photoresist pattern of FIGS. 3A, 3B and 3C.

Next, referring to FIGS. 3A, 3B and 3C, a photoresist pattern 7 as illustrated in FIG. 15 is formed by a photolithography process. Then, the silicon nitride layer 6 is etched by using the photoresist pattern 7 as a mask. Then, the upper gate electrode layer 5 and the lower gate electrode layer 4 are further etched by using the photoresist pattern 7 as a mask. Then, the photoresist pattern 7 is removed.

Note that FIGS. 3A, 3B and 3C are cross-sectional views taken along the lines I—I, II—II and III—III, respectively, of FIG. 15 which is a plan view of the photoresist pattern 7.

In FIGS. 3A, 3B and 3C, the upper gate electrode layer 5 and the lower gate electrode layer 4 are etched by using the photoresist pattern 7 as a mask; however, the upper gate electrode layer 5 and the lower gate electrode layer 4 can be etched by using the silicon nitride layer 6 as a mask. In this case, after the silicon nitride layer 6 is etched, the photoresist pattern 7 is removed.

Next, referring to FIGS. 4,A, 4B and 4C, N-type impurities such as arsenic are implanted into the silicon substrate 1 by using the silicon nitride layer 6 as a mask to form $N^+$-type impurity diffusion regions 8.

Figure 5A:
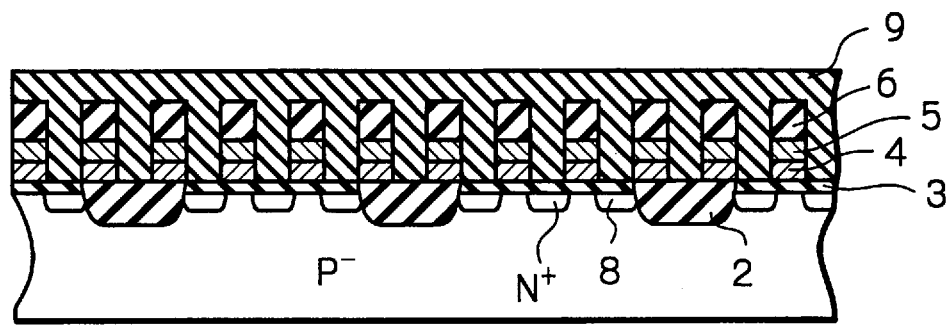
Figure 5B:
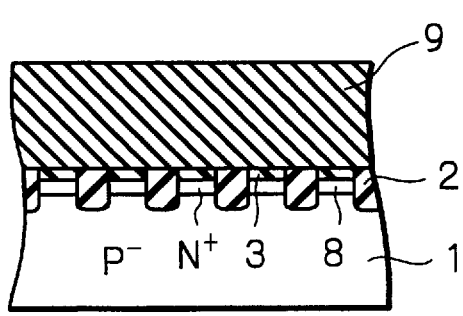
Figure 5C:
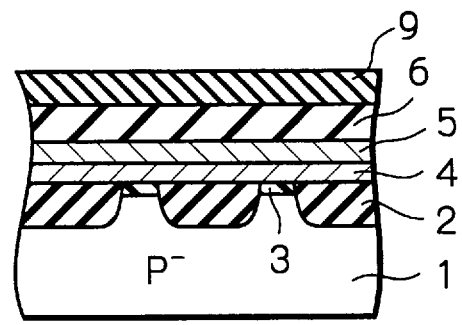

Next, referring to FIGS. 5A, 5B and 5C, an insulating layer 9 made of silicon oxide or boron-included phosphosilicated glass (BPSG) is formed on the entire surface by a CVD process.

Figure 6A:
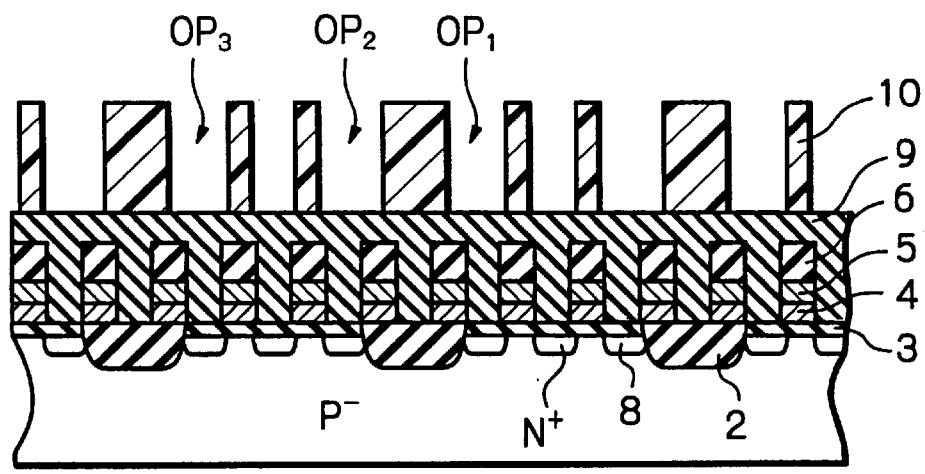
Figure 6B:
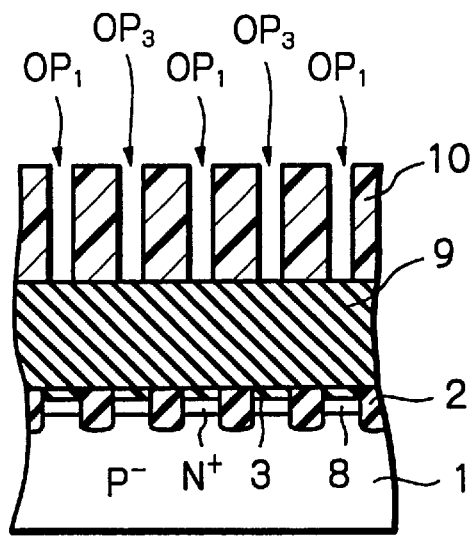
Figure 6C:
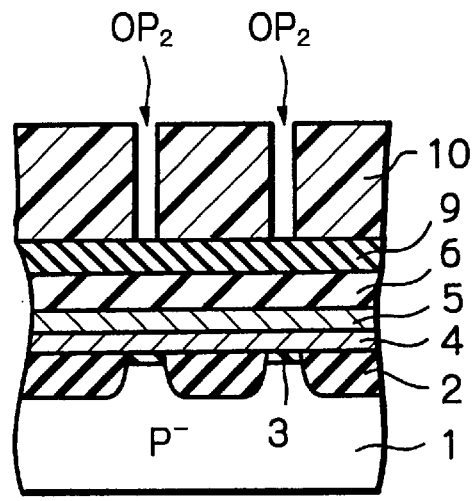
Figure 16:
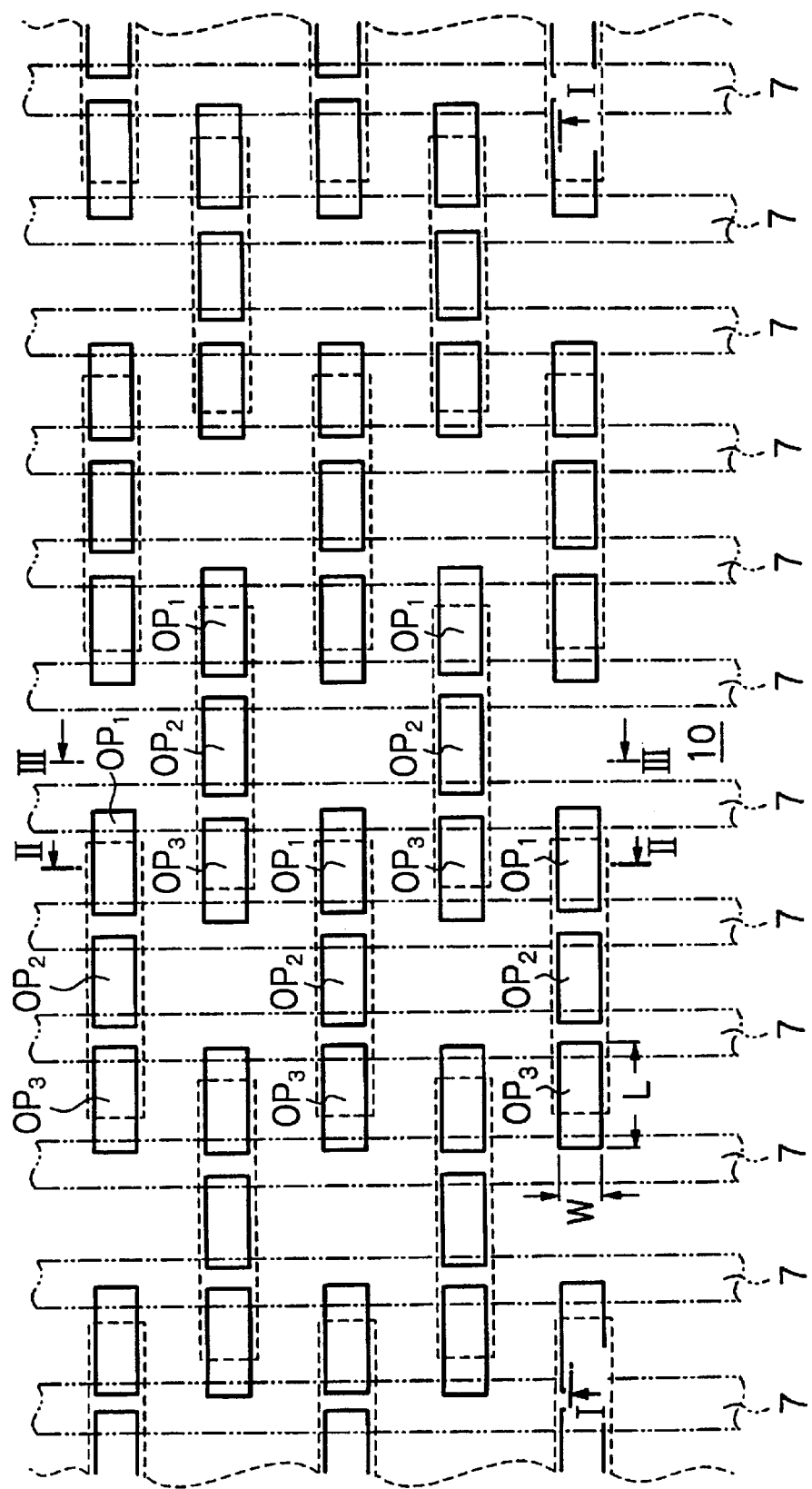
FIG. 16 is a plan view of the photoresist pattern of FIGS. 6A, 6B and 6C.

Next, referring to FIGS. 6A, 6B and 6C, a photoresist pattern 10 as illustrated in FIG. 16 is formed by a photolithography process. Note that the photoresist pattern 10 has a plurality of holes i,e., $OP_1$, $OP_2$ and $OP_3$ each corresponding to one pad polycrystalline silicon electrode.

Figure 7A:
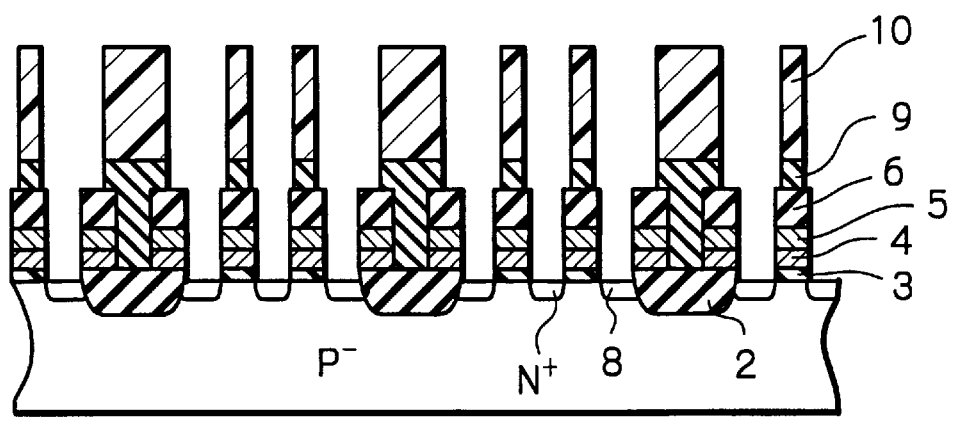
Figure 7B:
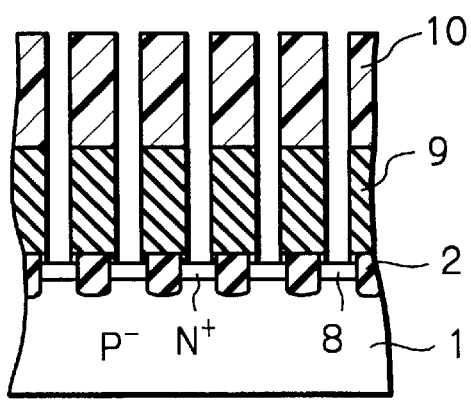
Figure 7C:
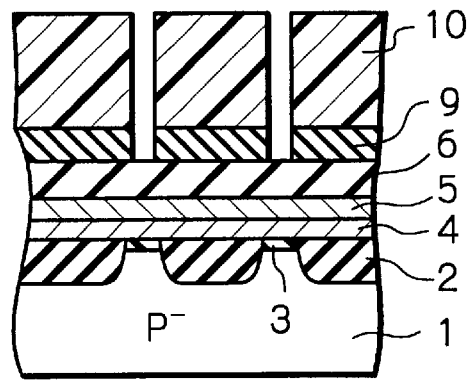

Next, referring to FIGS. 7A, 7B and 7C, the insulating layer 9 is etched by a dry or wet etching process using the photoresist pattern 10 as a mask. In this case, the silicon nitride layer 6 serves as an etching stopper. Then, the photoresist pattern 10 is removed.

Figure 8A:
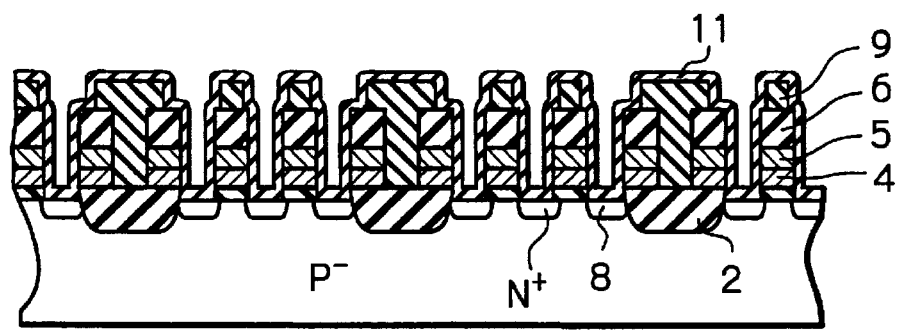
Figure 8B:
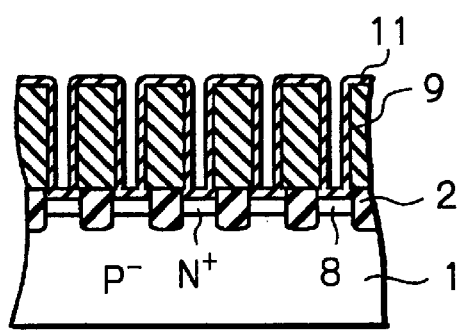
Figure 8C:
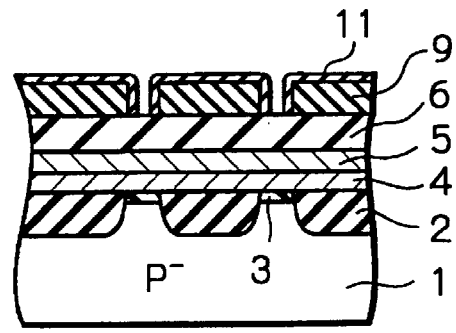

Next, referring to FIGS. 8A, 8B and 8C, an insulating layer 11 made of silicon oxide or silicon nitride is deposited on the entire surface.

Figure 9A:
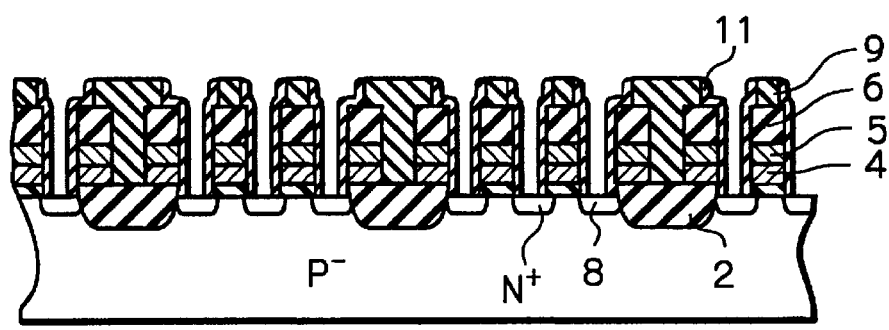
Figure 9B:
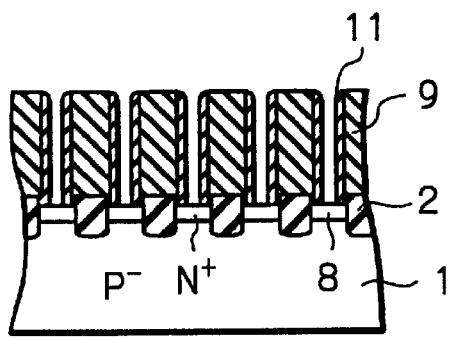
Figure 9C:
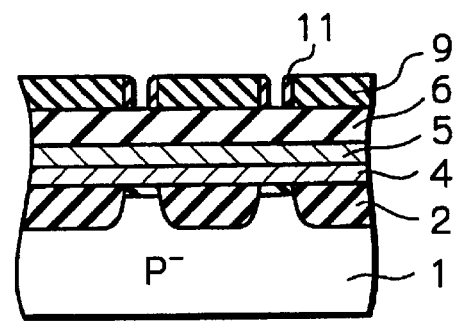

Next, referring to FIGS. 9A, 9B and 9C, the insulating layer 11 is etched back, so that the insulating layer 11 is left only on the sidewalls of the insulating layer 9.

Figure 10A:
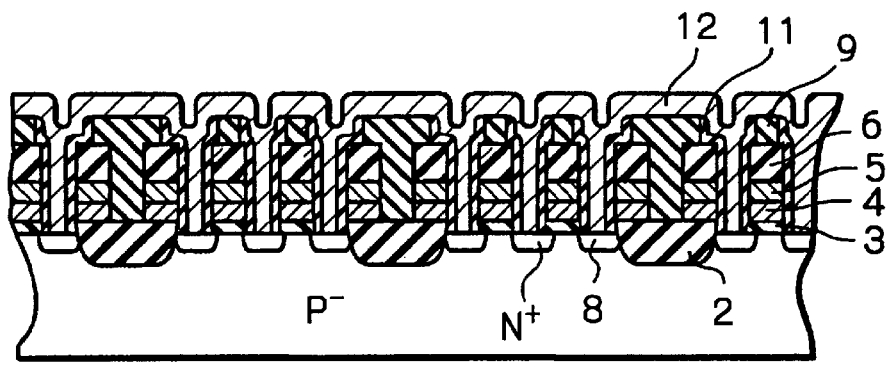
Figure 10B:
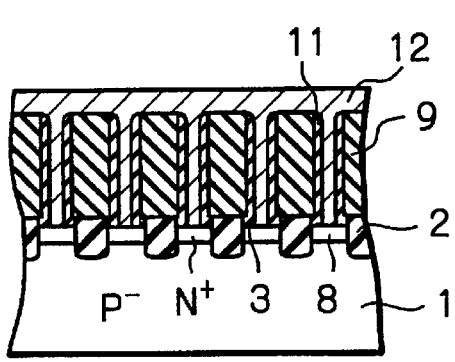
Figure 10C:
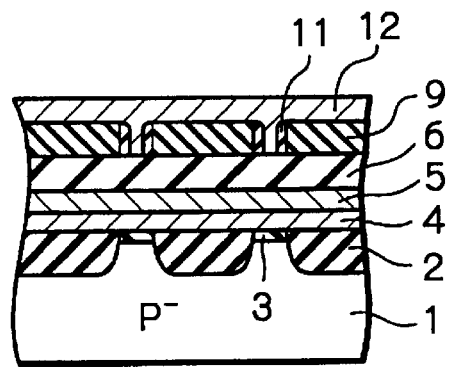

Next, referring to FIGS. 10A, 10B and 10C, a polycrystalline silicon layer 12 is deposited on the entire surface by a CVD process.

Figure 11A:
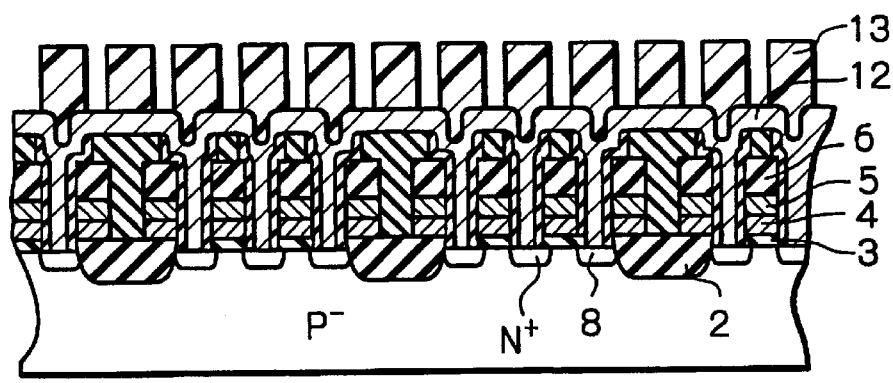
Figure 11B:
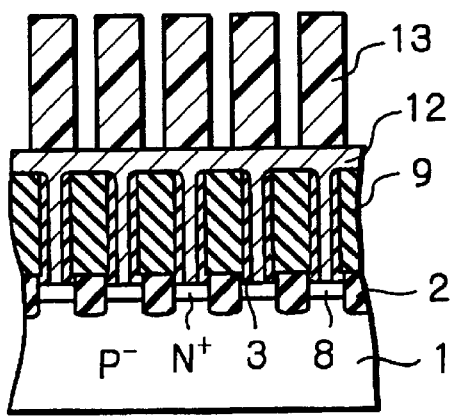
Figure 11C:
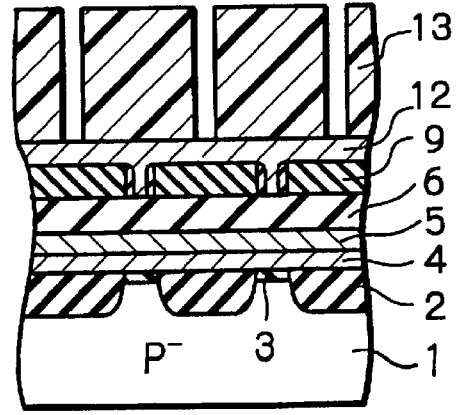

Next, referring to FIGS. 11A, 11B and 11C, a photoresist pattern 13 corresponding to the pad polycrystalline electrodes is formed by a photolithography process.

Figure 12A:
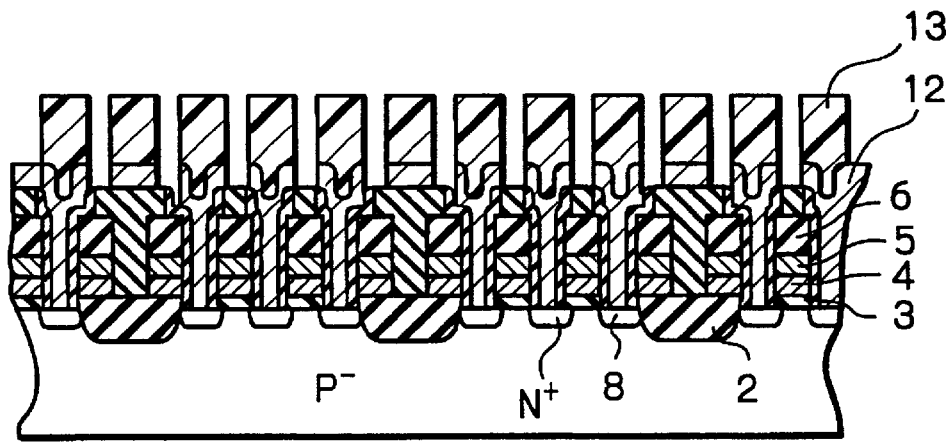
Figure 12B:
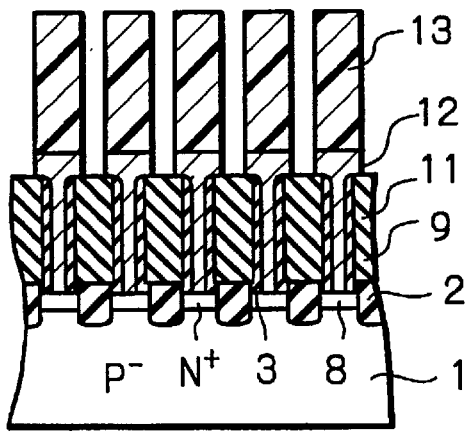
Figure 12C:
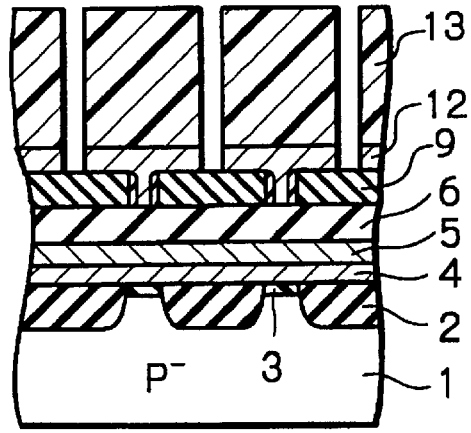

Next, referring to FIGS. 12A, 12B and 12C, the polycrystalline silicon layer 12 is etched by a dry or wet etching process using the photoresist pattern 13 as a mask. As a result, the polycrystalline silicon layer 12 becomes the pad polycrystalline silicon electrodes. Then, the photoresist pattern 13 is removed.

Figure 13:
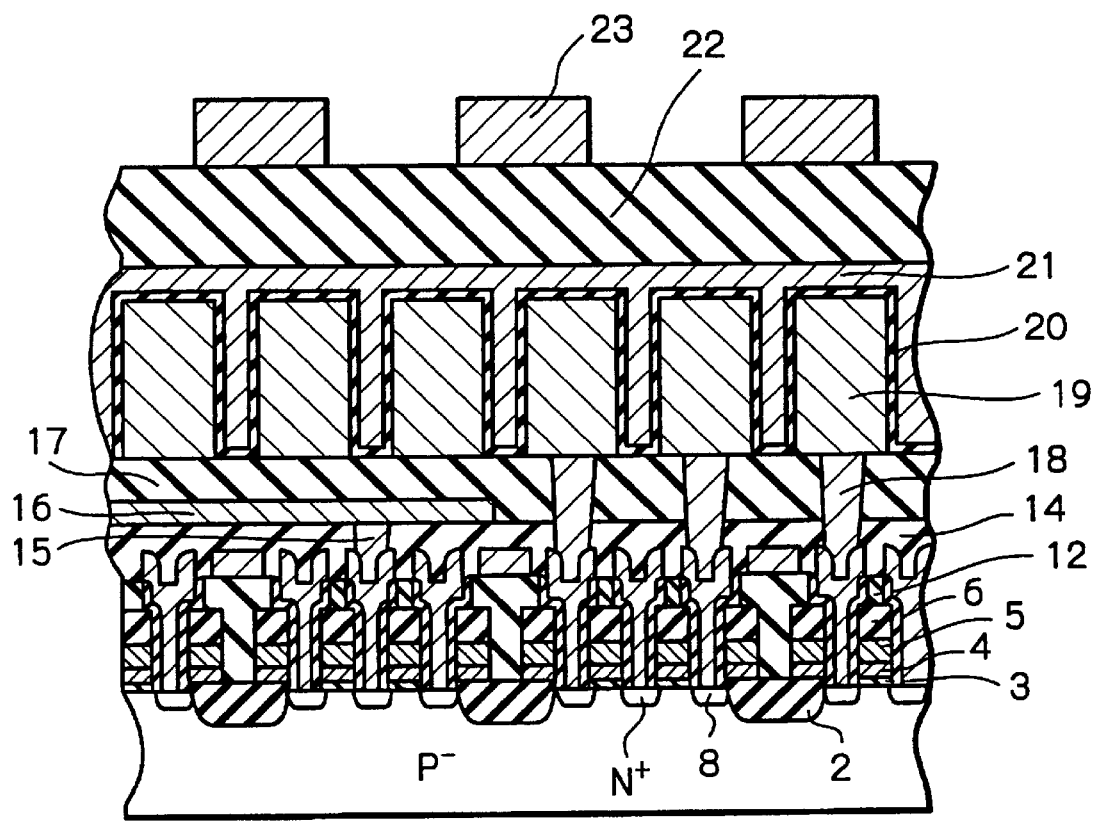

Finally, referring to FIG. 13 which corresponds to FIG. 12A, an insulating layer 14 is formed on the entire surface, and a bit contact layer 15 is buried in the insulating layer 14. Also, a bit line layer 16 is formed on the insulating 14 and is connected to the bit contact layer 15.

Then, after an insulating layer 17 is formed on the entire surface, and a capacitance contact layer 18 is buried in the insulating layer 17.

Then, a lower capacitor electrode 19, a capacitor insulating layer 20 and an upper capacitor electrode 21 are formed.

Then, an insulating layer 22 is formed on the entire surface, and an aluminum layer 23 is formed on the insulating layer 22, thus completing the DRAM device.

In the above-described prior art manufacturing method, however, the photoresist pattern 10 has three openings $OP_1$, $OP_2$ and $OP_3$ (see FIG. 16) for each field pattern or active area. In this case, the width W and the length L of each of the openings $OP_1$, $OP_2$ and $OP_3$ coincide with the corresponding minimum sizes of the photolithography process to obtain a fine structure. Therefore, the margin of the openings $OP_1$, $OP_2$ and $OP_3$ is very small.

Figure 17C:
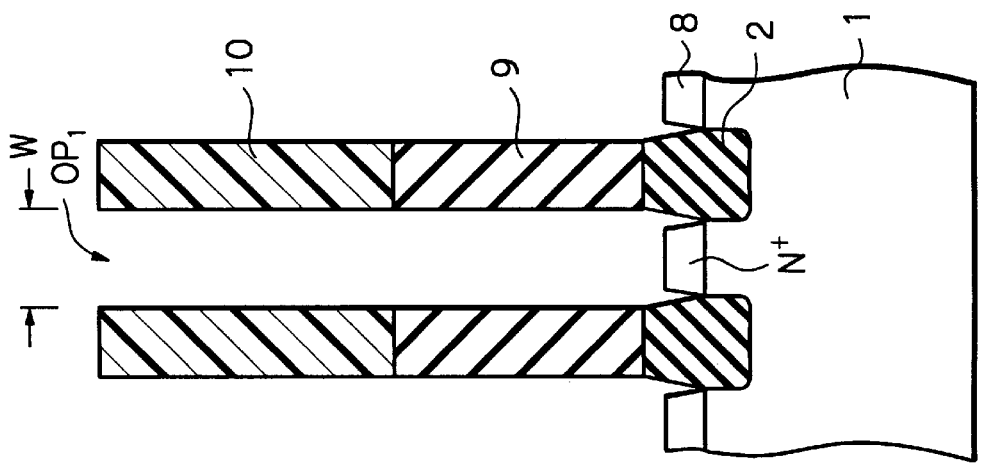
FIGS. 17A, 17B and 17C are cross-sectional views for explaining the problem in the prior art manufacturing method.
Figure 17B:
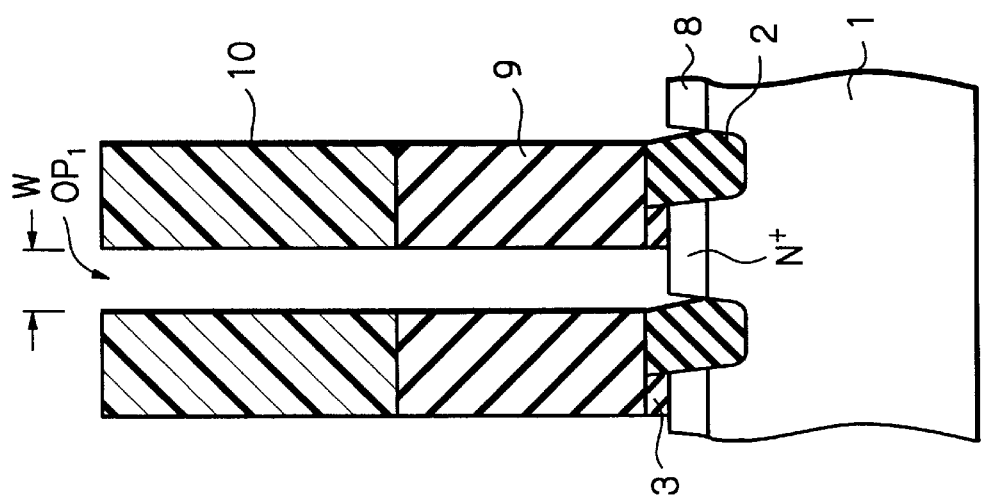
Figure 17A:
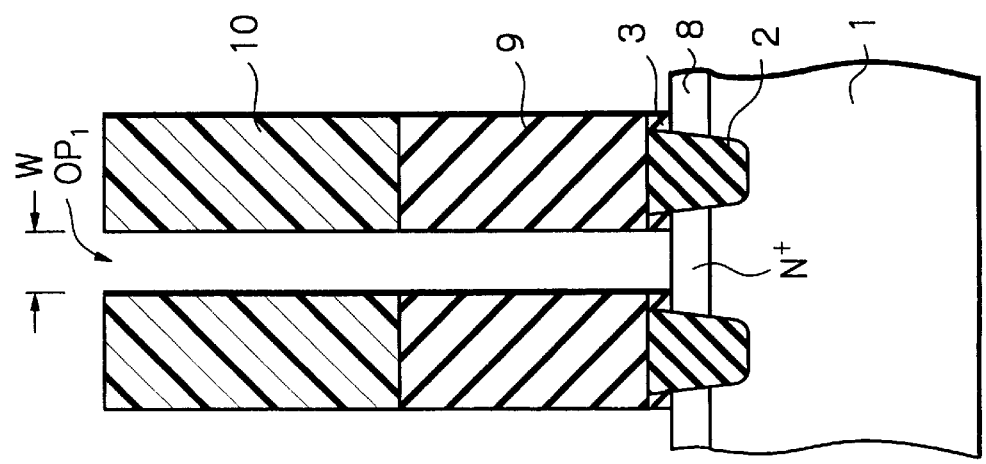
Figure 18A:
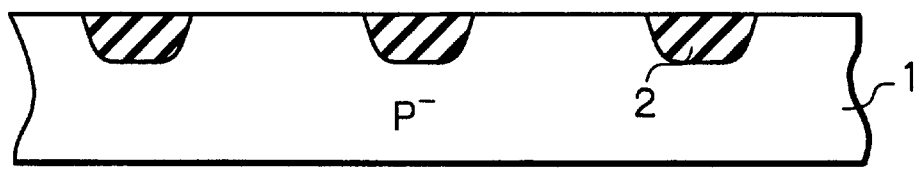
FIGS. 18A, 18B, 18C, 19A, 19B, 19C, 20A, 20B, 20C, 21A, 21B, 21C, 22A, 22B, 22C, 23A, 23B, 23C, 24A, 24B, 24C, 25A, 25B, 25C, 26A, 26B, 26C, 27A, 27B, 27C, 28A, 28B, 28C, 29A, 29B, 29C and 30 are cross-sectional views for explaining a first embodiment of the method for manufacturing a DRAM device according to the present invention.
Figure 18B:
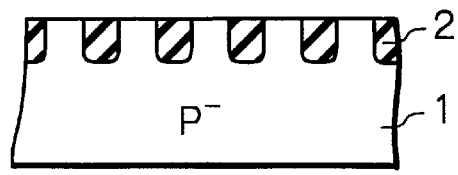
Figure 18C:
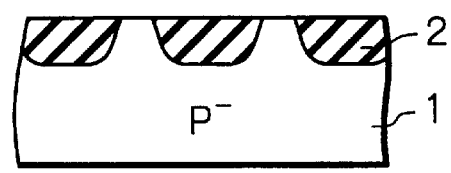
Figure 19A:
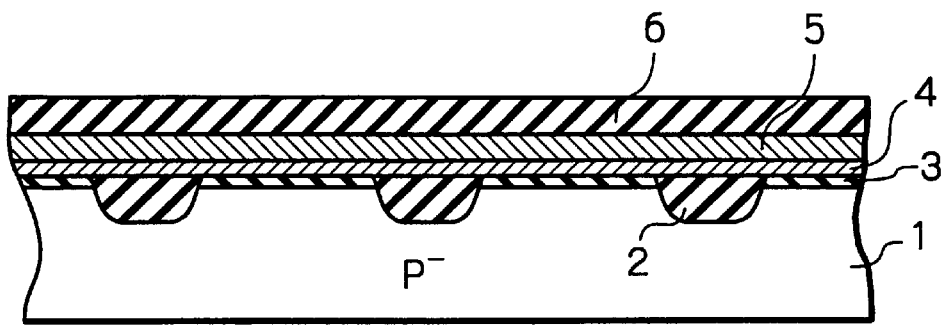
Figure 19B:
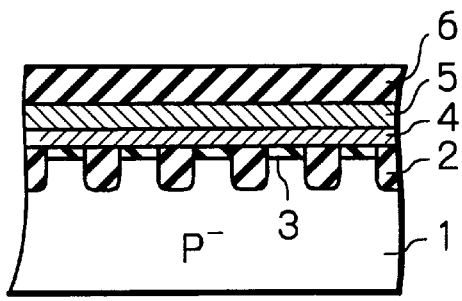
Figure 19C:
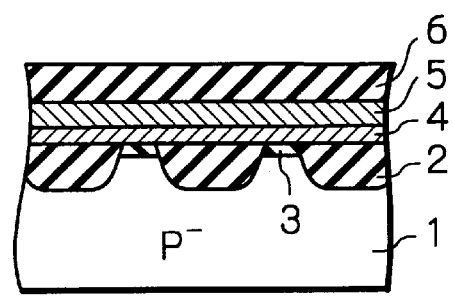
Figure 20A:
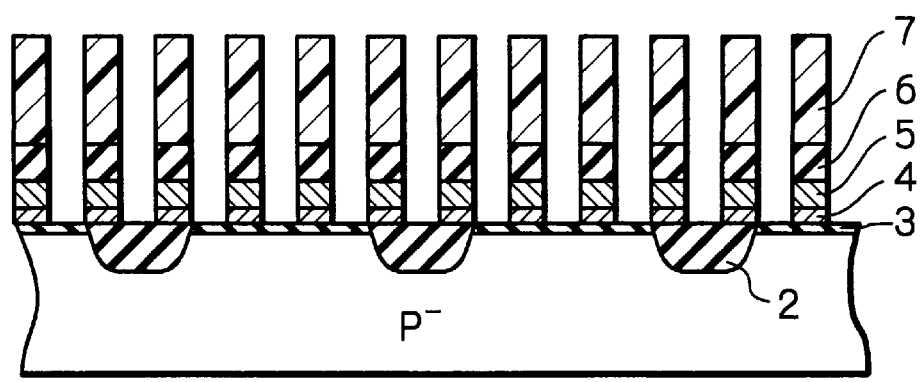
Figure 20B:
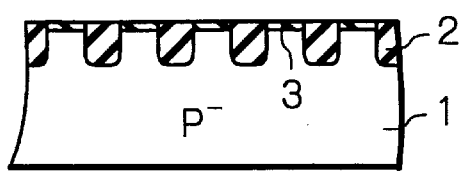
Figure 20C:
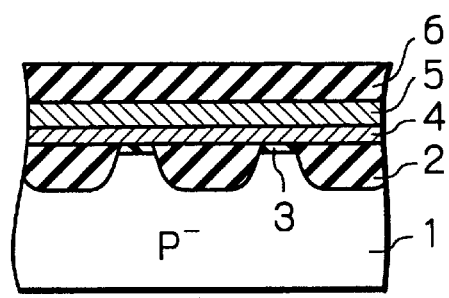
Figure 21A:
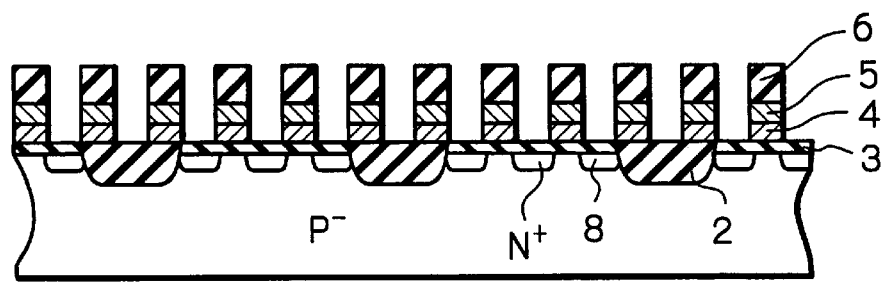
Figure 21B:
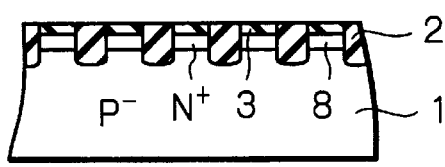
Figure 21C:
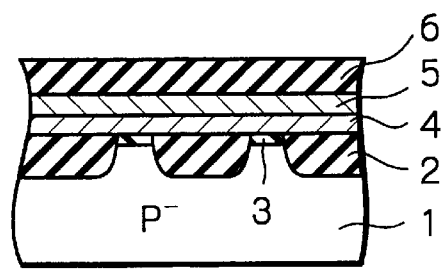
Figure 22A:
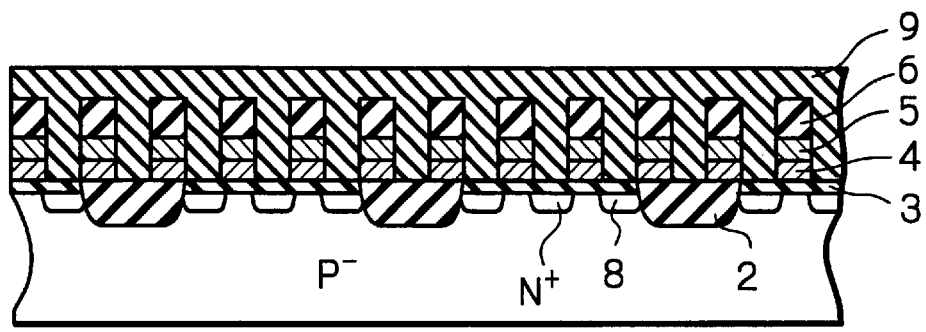
Figure 22B:
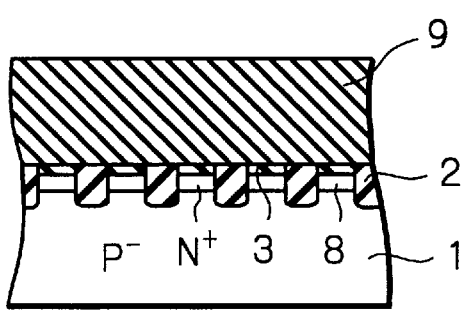
Figure 22C:
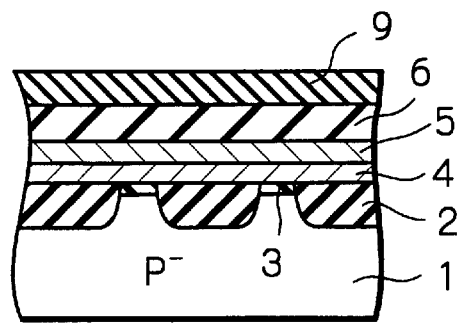

The problem in the prior art manufacturing method is explained with reference to FIGS. 17A, 17B and 17C which are enlargements of FIG. 7B. That is, if the opening $OP_1$ is at an optimum location as illustrated in FIG. 17A, the field silicon oxide layer 2 is hardly etched. On the other hand, if the opening $OP_1$ is deviated a little from the optimum location, as illustrated in FIG. 17B, one side of the field silicon oxide layer 2 is also etched which would deteriorate the isolation properties of the field silicon oxide layer 2. Also, if the opening $OP_1$ is larger than the optimum size, i.e., the width W becomes larger as illustrated in FIG. 17C, both sides of the field silicon oxide layer 2 are etched which would deteriorate the isolation properties of the field silicon oxide layer 2.

A first embodiment of the method for manufacturing a DRAM device according to the present invention will be explained with reference to FIGS. 18A, 18B, 18C, 19A, 19B, 19C, 20A, 20B, 20C, 21A, 21B, 21C, 22A, 22B, 22C, 23A, 23B, 23C, 24A, 24B, 24C, 25A, 25B, 25C, 26A, 26B, 26C, 27A, 27B, 27C, 28A, 28B, 28C, 29A, 29B, 29C, 30 and 31.

The steps as illustrated in FIGS. 18A, 18B, 18C, 19A, 19B, 19C, 20A, 20B, 20C, 21A, 21B, 21C, 22A, 22B and 22C are the same as those as illustrated in FIGS. 1A, 1B, 1C, 2A, 2B, 2C, 3A, 3B, 3C, 4A, 4B, 4C, 5A, 5B and 5C, respectively, of the prior art manufacturing method.

Figure 23A:
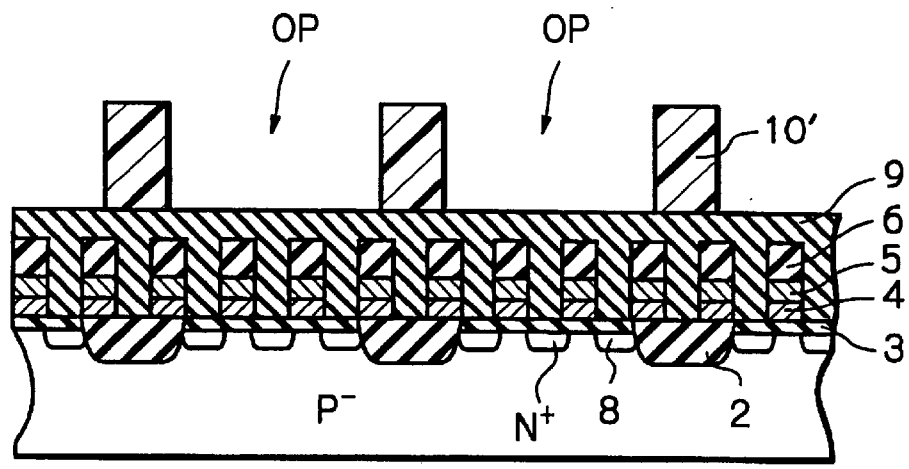
Figure 23B:
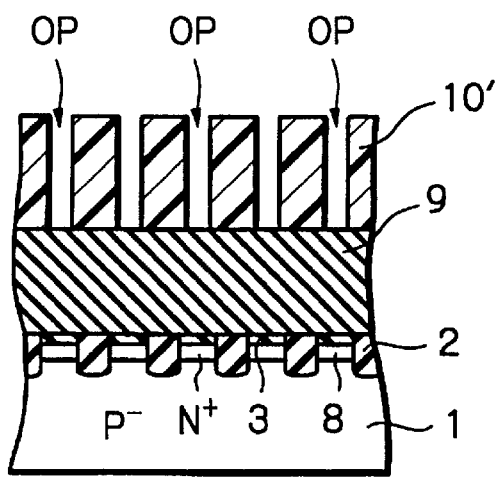
Figure 23C:
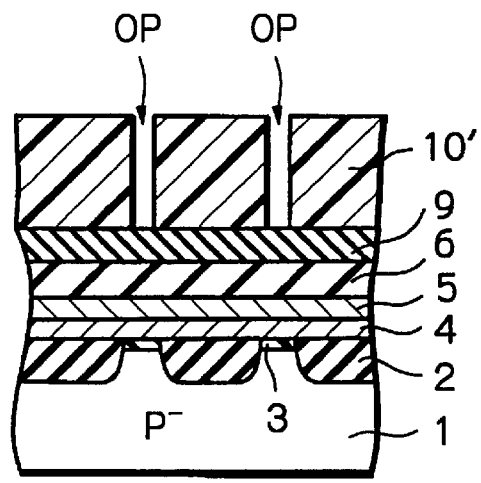
Figure 31:
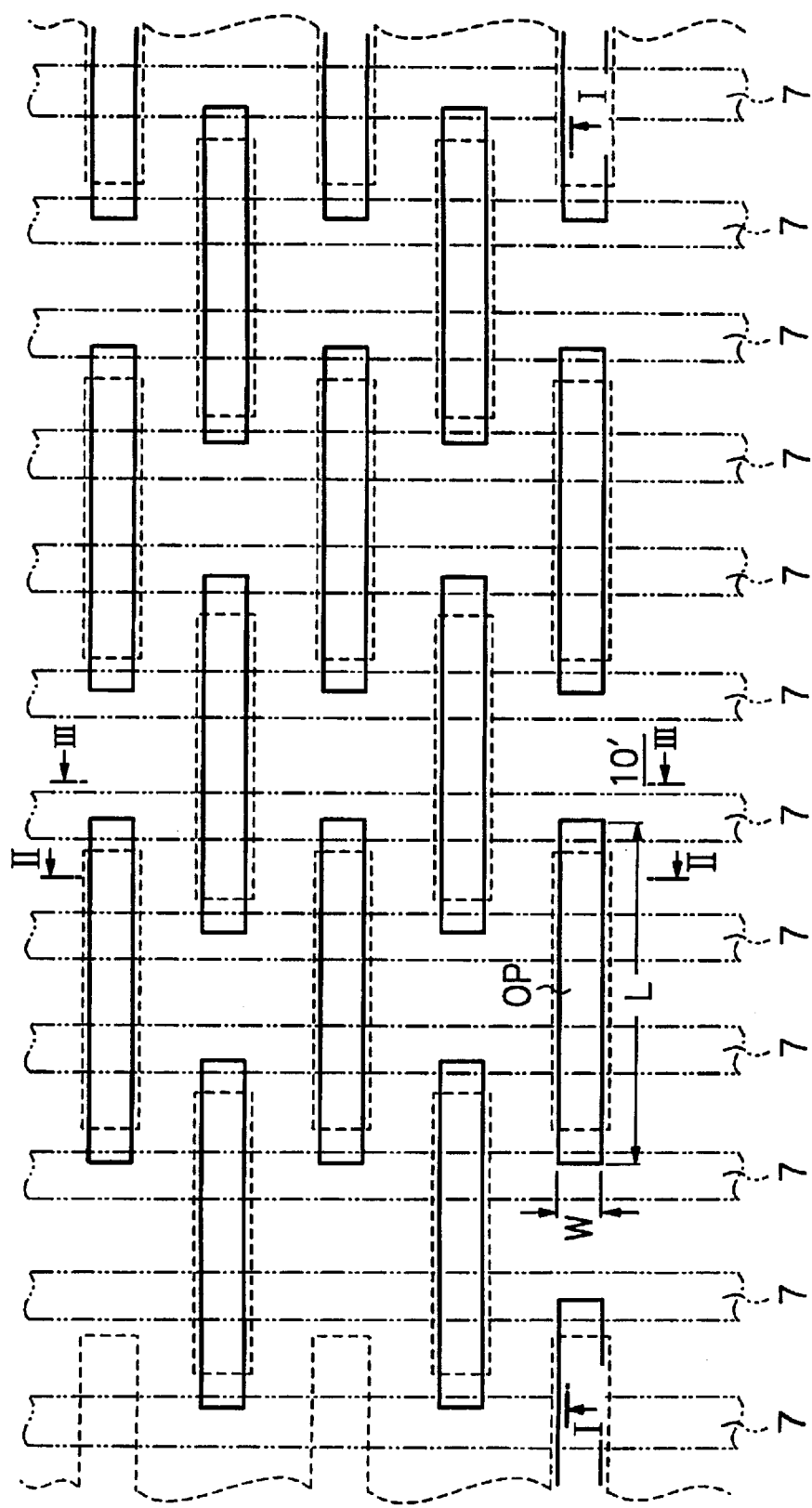
FIG. 31 is a plan view of the photoresist pattern of FIGS. 23A, 23B and 23C.
Figure 32A:
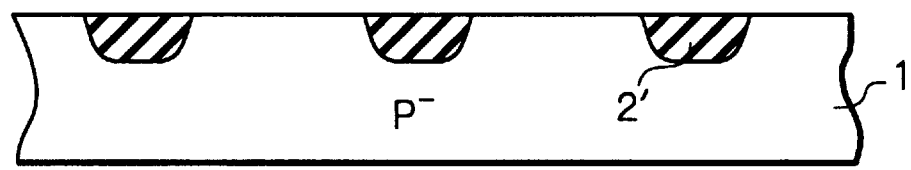
Figure 32B:
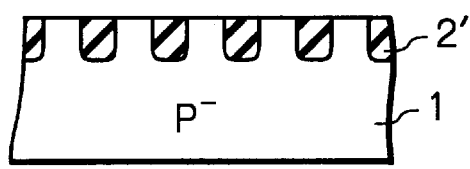
Figure 32C:
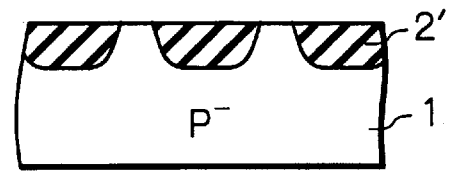
Figure 32D:
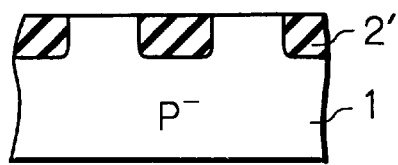
Figure 33A:
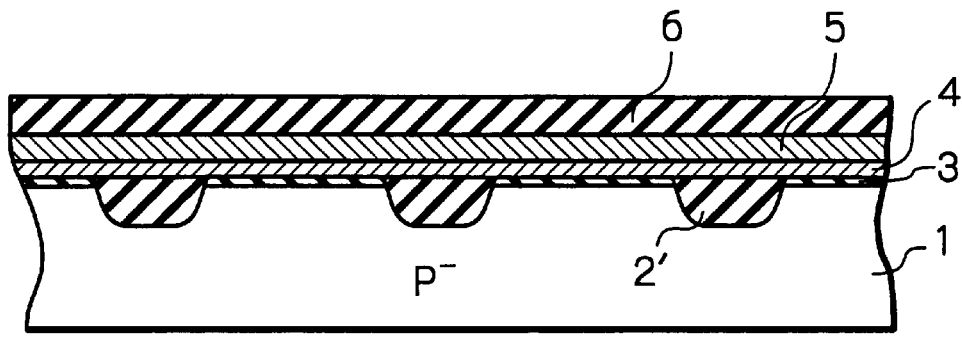
Figure 33B:
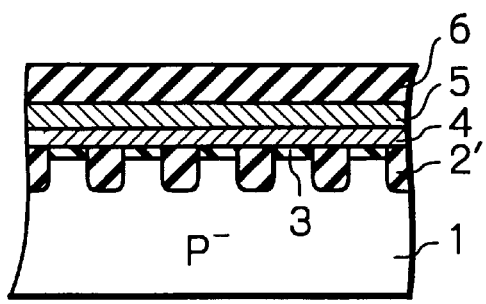
Figure 33C:
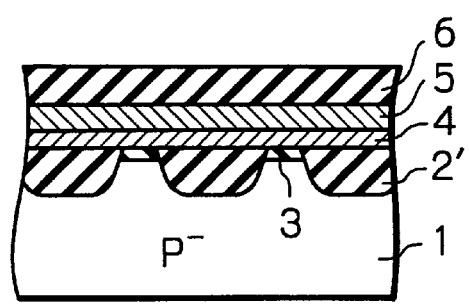
Figure 33D:
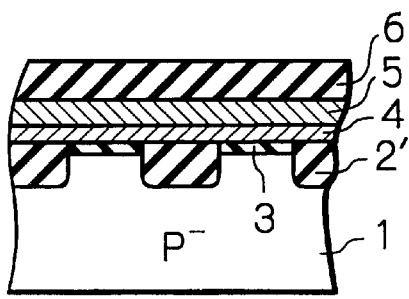
Figure 34A:
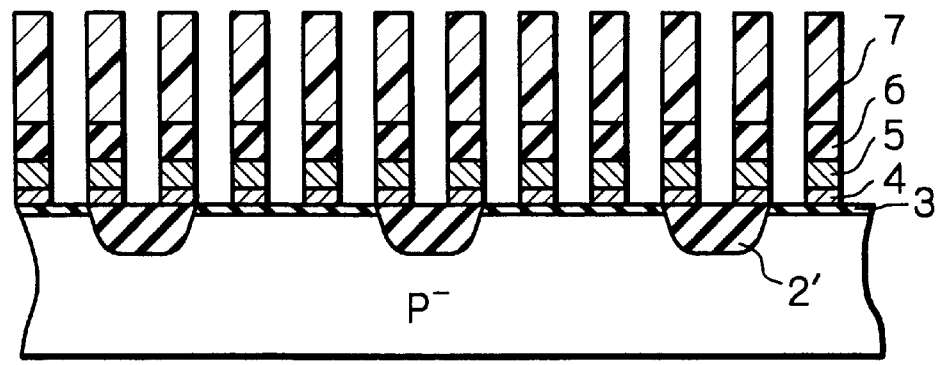
Figure 34B:
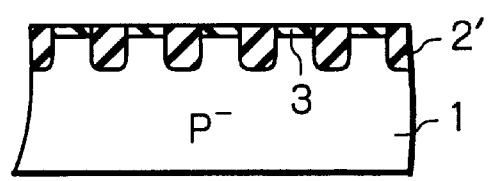
Figure 34C:
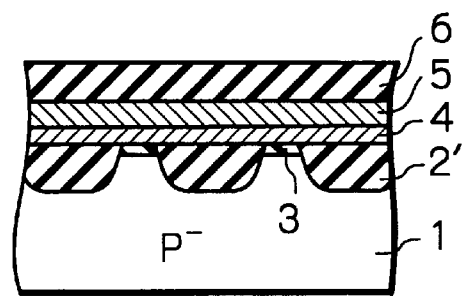
Figure 34D:
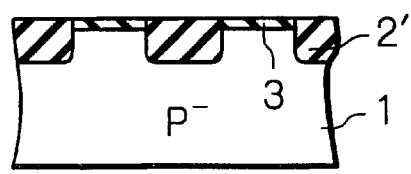
Figure 35A:
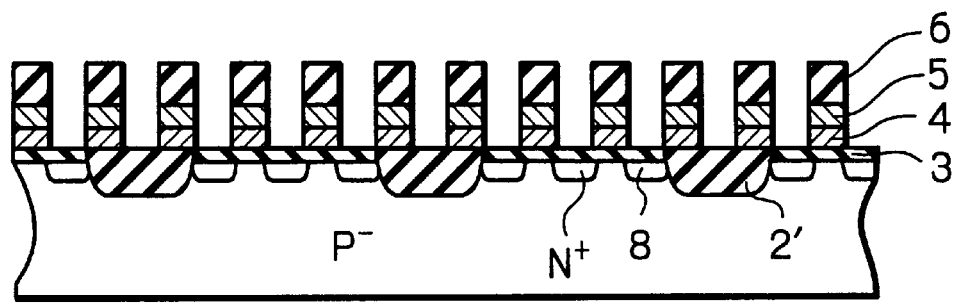
Figure 35B:
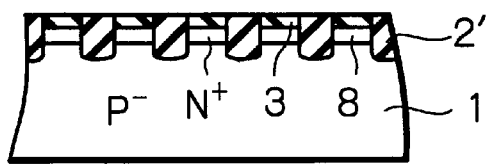
Figure 35C:
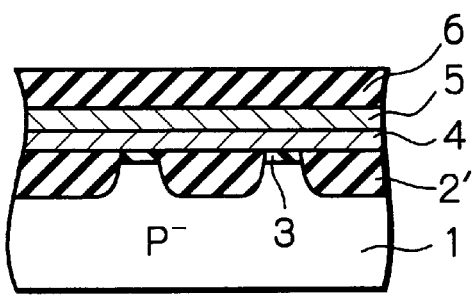
Figure 35D:
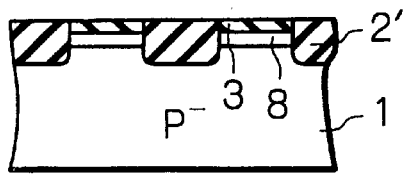
Figure 36A:
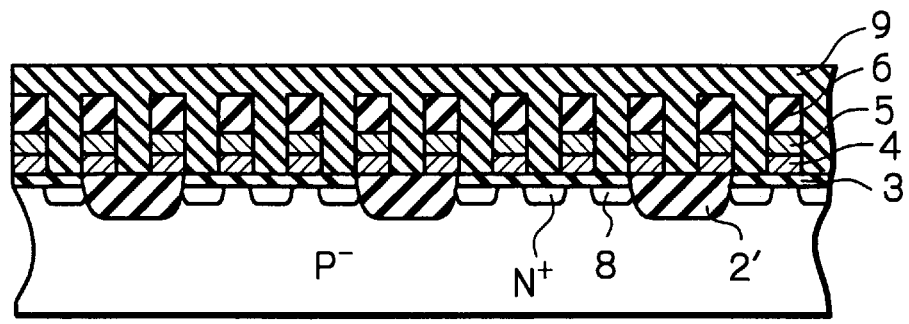
Figure 36B:
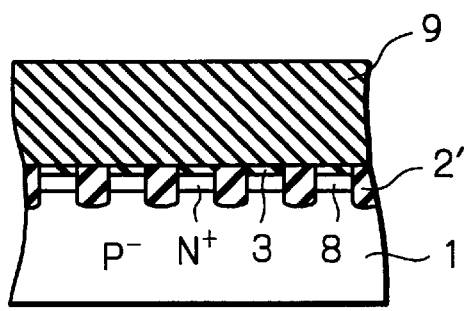
Figure 36C:
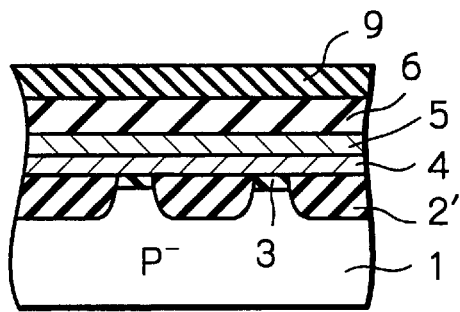
Figure 36D:
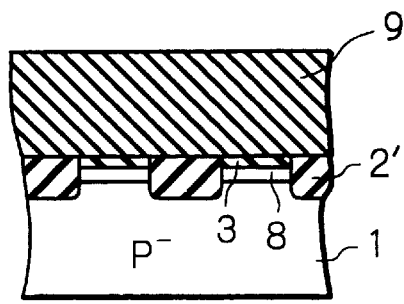
Figure 38A:
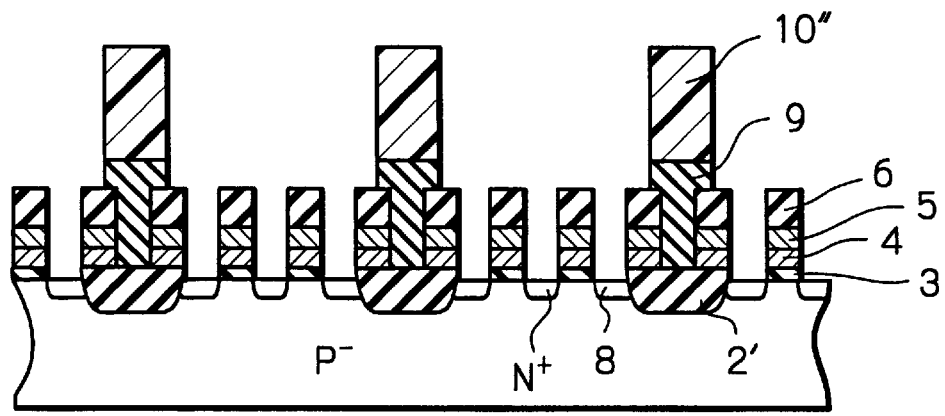
Figure 38B:
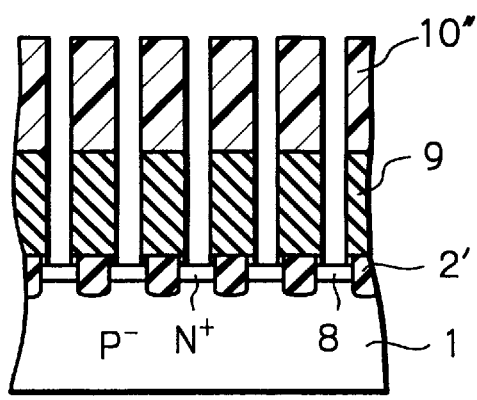
Figure 38C:
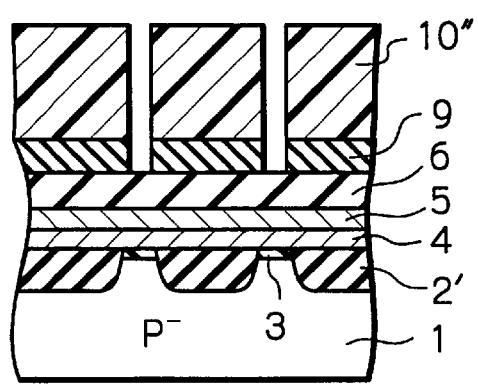
Figure 38D:
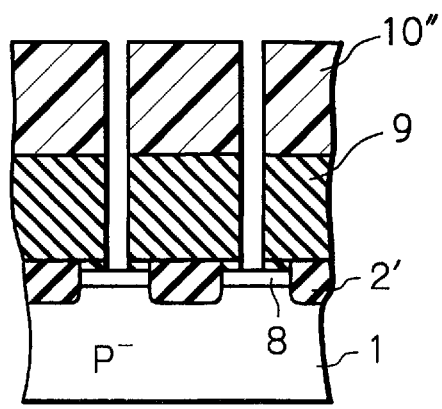
Figure 39A:
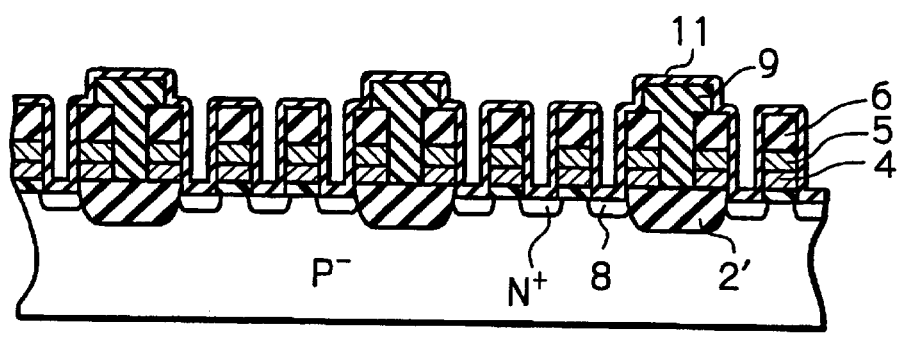
Figure 39B:
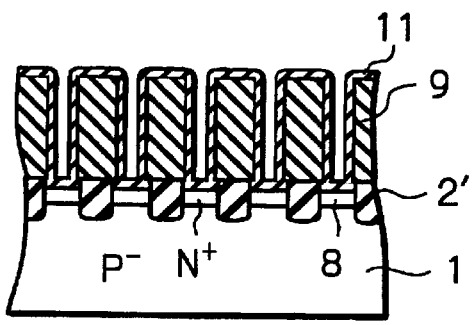
Figure 39C:
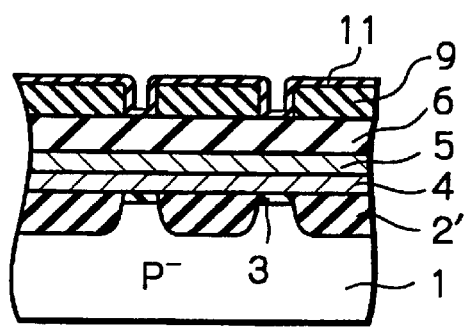
Figure 39D:
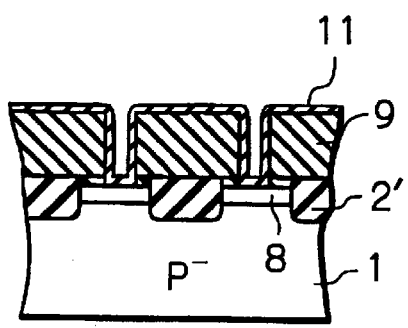
Figure 40A:
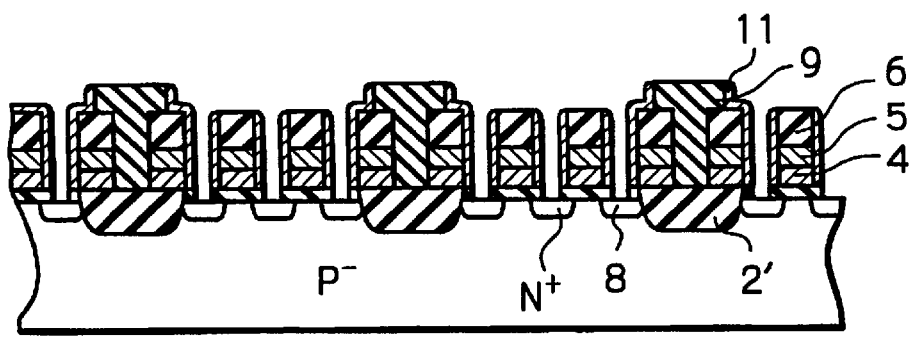
Figure 40B:
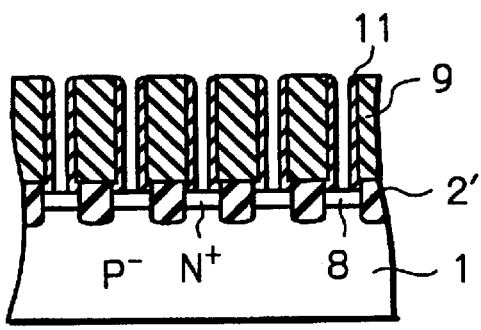
Figure 40C:
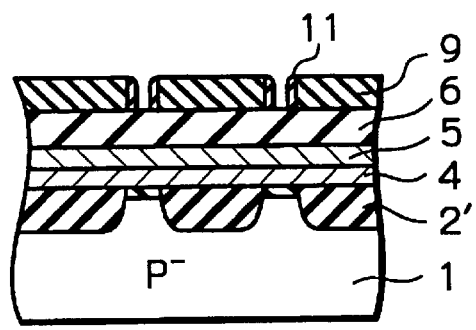
Figure 40D:
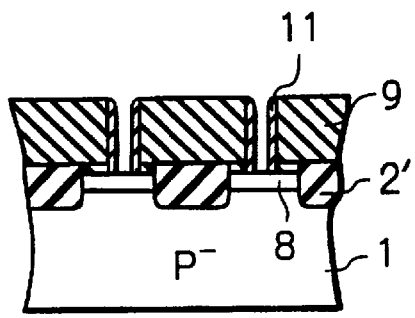
Figure 41A:
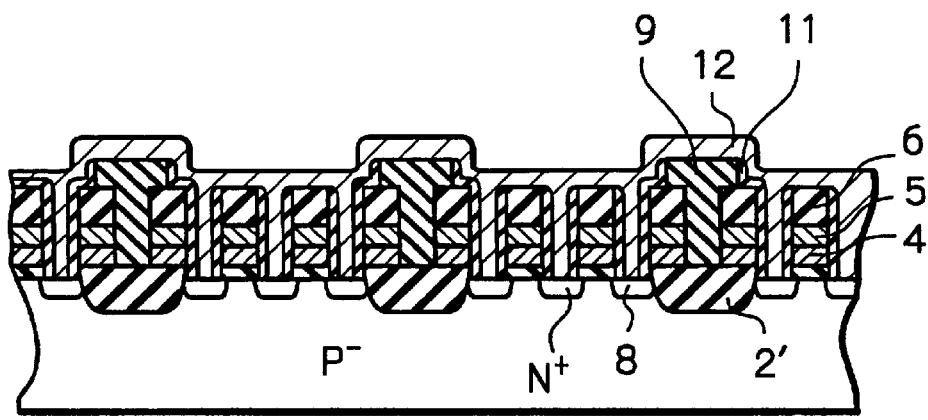
Figure 41B:
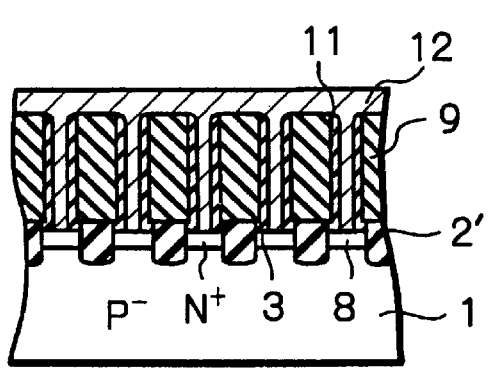
Figure 41C:
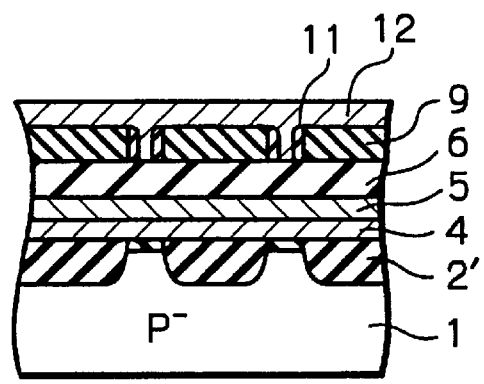
Figure 41D:
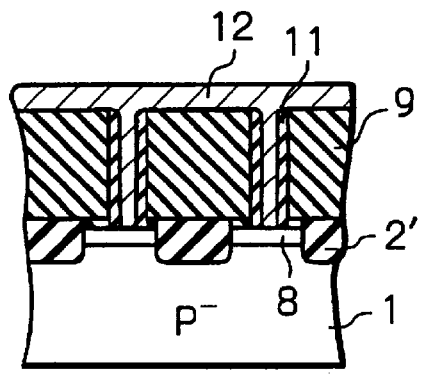
Figure 42A:
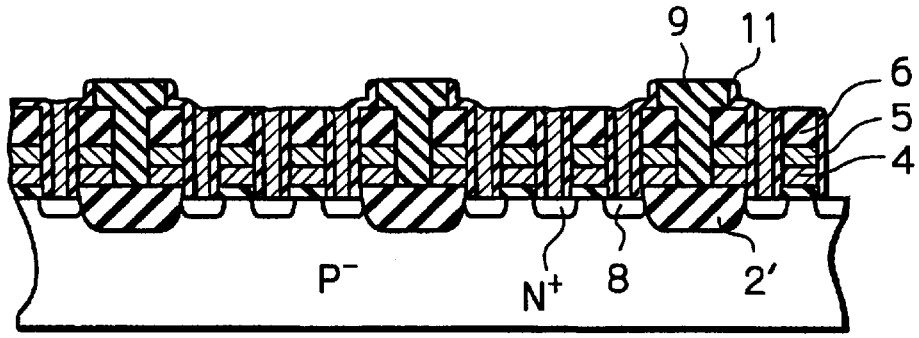
Figure 42B:
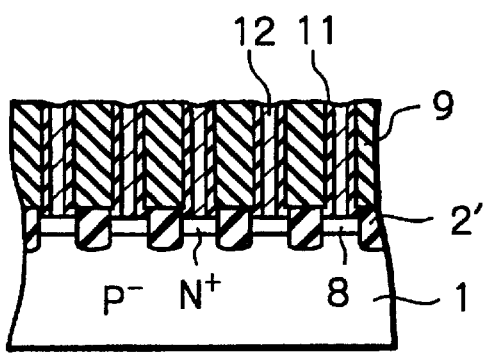
Figure 42C:
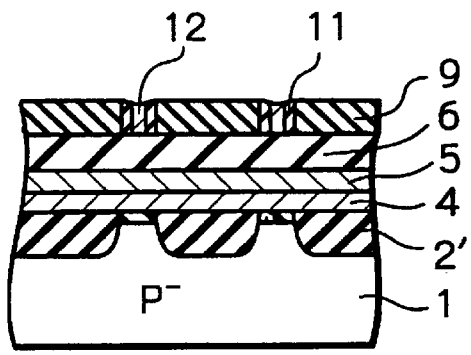
Figure 42D:
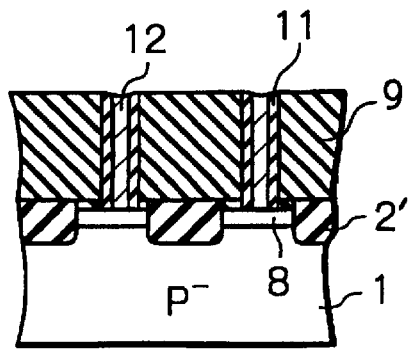

Next, referring to FIGS. 23A, 23B and 23C, a photoresist pattern 10' as illustrated in FIG. 31 is formed by a photolithography process. Note that the photoresist pattern 10' has a plurality of holes view opening up each corresponding to one field pattern.

Figure 24A:
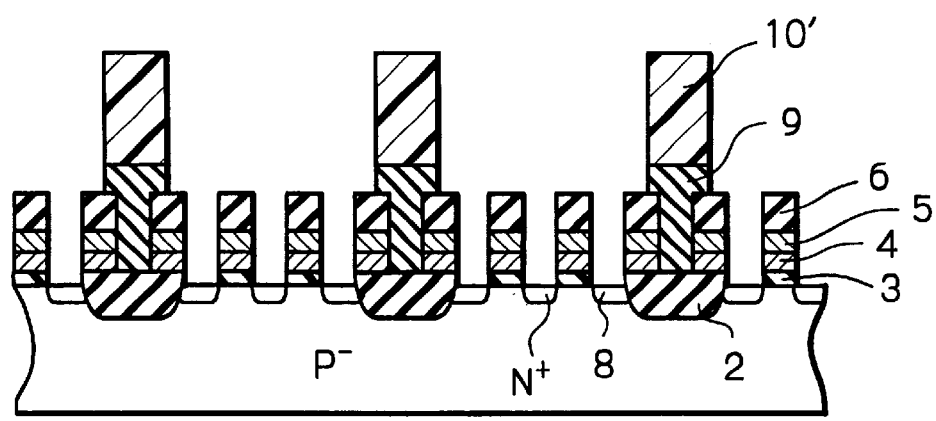
Figure 24B:
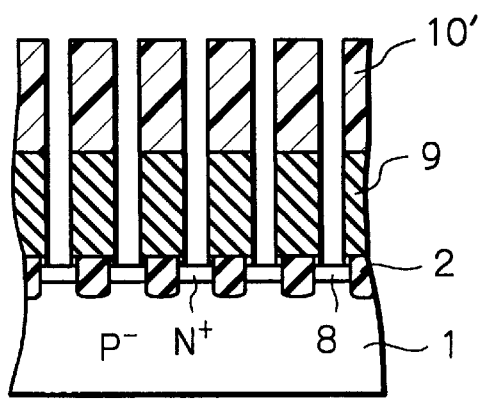
Figure 24C:
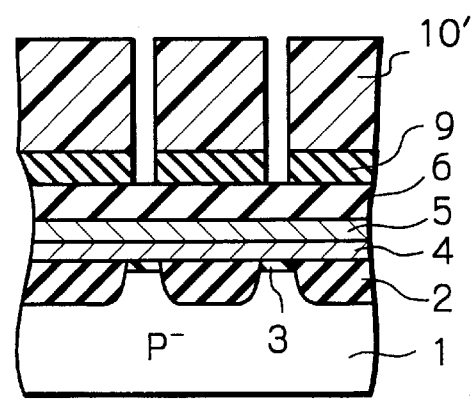

Next, referring to FIGS. 24A, 24B and 24C, in the same way as in FIGS. 7A, 7B and 7C, the insulating layer 9 is etched by a dry or wet etching process using the photoresist pattern 10' as a mask. In this case, the silicon nitride layer 6 serves as an etching stopper. Then, the photoresist pattern 10' is removed.

Figure 25A:
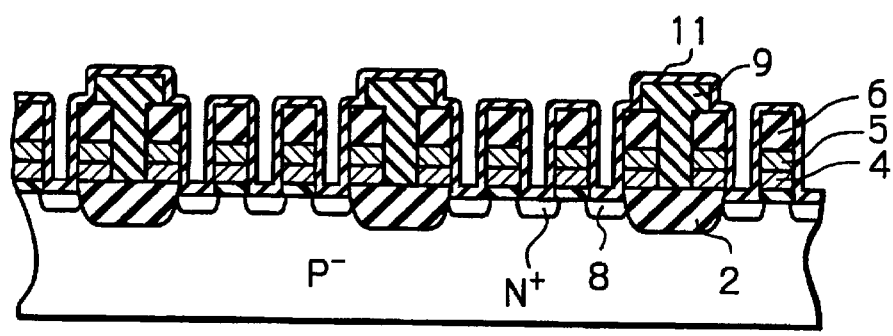
Figure 25B:
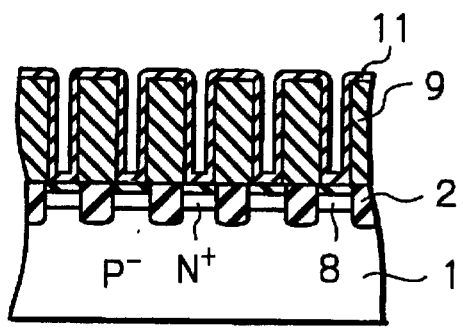
Figure 25C:
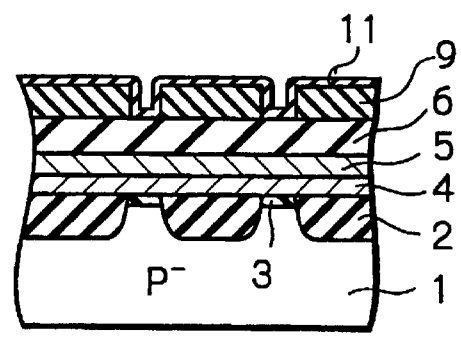

Next, referring to FIGS. 25A, 25B and 25C, in the same way as in FIGS. 8A, 8B and 8C, an insulating layer 11 made of silicon oxide or silicon nitride is deposited on the entire surface.

Figure 26A:
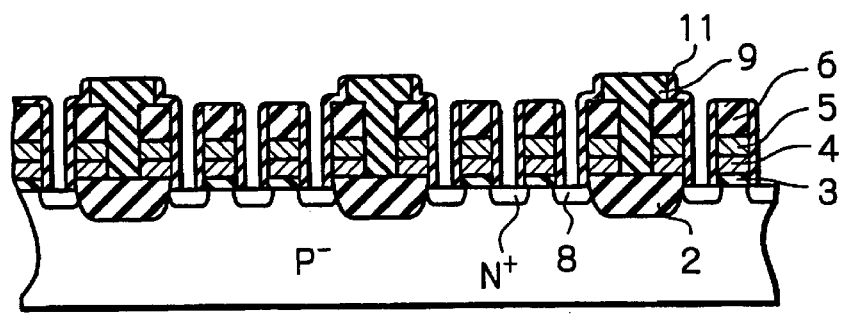
Figure 26B:
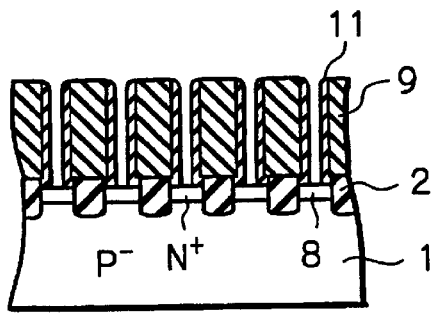
Figure 26C:
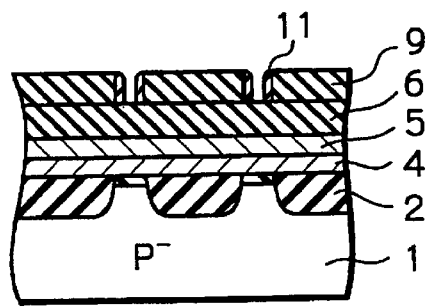

Next, referring to FIGS. 26A, 26B and 26C, in the same way as in FIGS. 9A, 9B and 9C, the insulating layer 11 is etched back, so that the insulating layer 11 is left only on the sidewalls of the insulating layer 9.

Figure 27A:
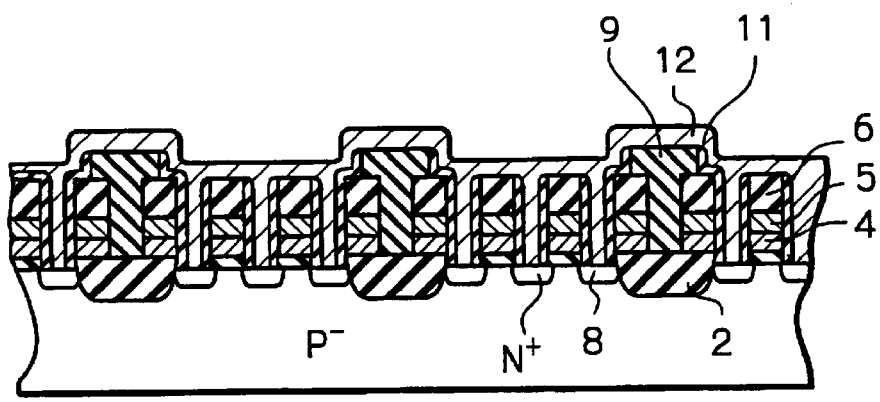
Figure 27B:
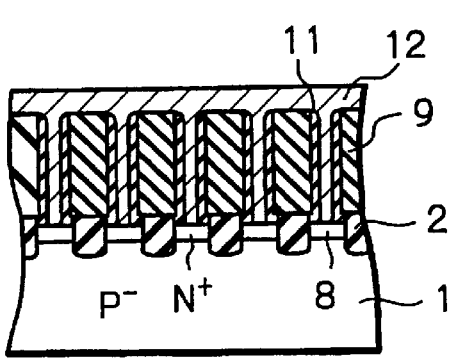
Figure 27C:
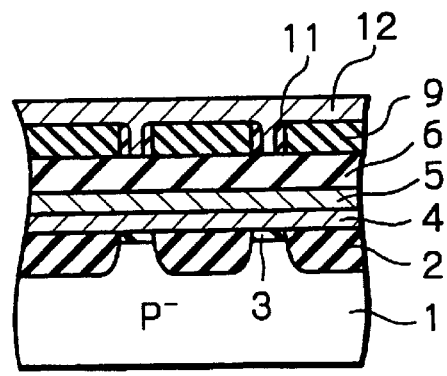

Next, referring to FIGS. 27A, 27B and 27C, in the same way as in FIGS. 10A, 10B and 10C, a polycrystalline silicon layer 12 is deposited on the entire surface by a CVD process.

Figure 28A:
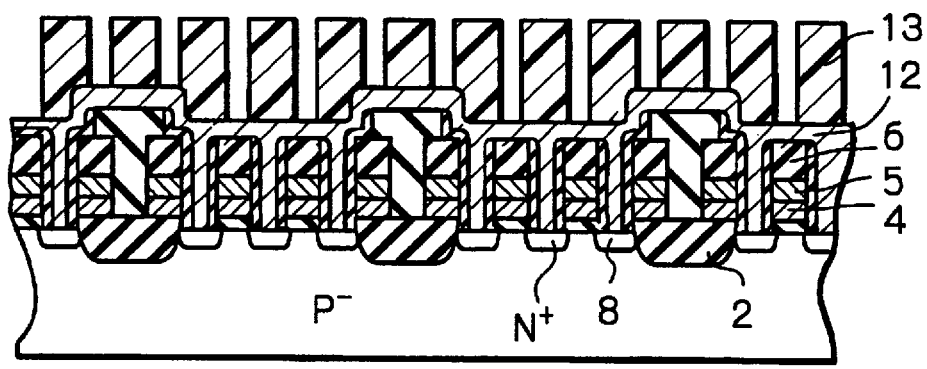
Figure 28B:
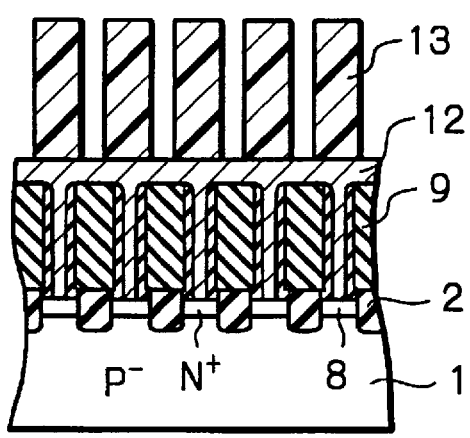
Figure 28C:
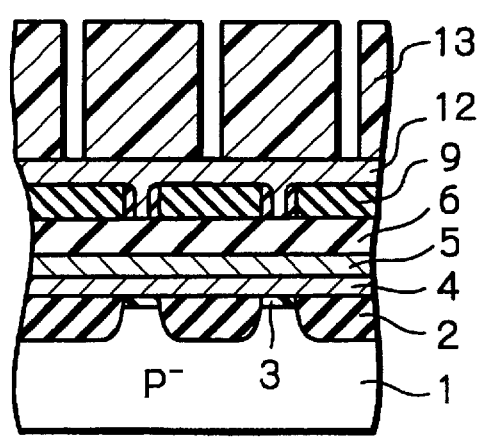

Next, referring to FIGS. 28A, 28B and 28C, in the same way as in FIGS. 11A, 11B and 11C, a photoresist pattern 13 corresponding to the pad polycrystalline electrodes is formed by a photolithography process.

Figure 29A:
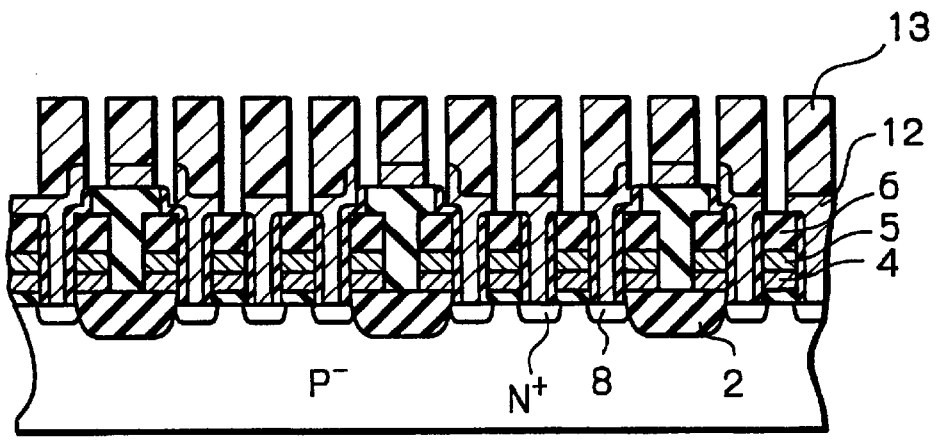
Figure 29B:
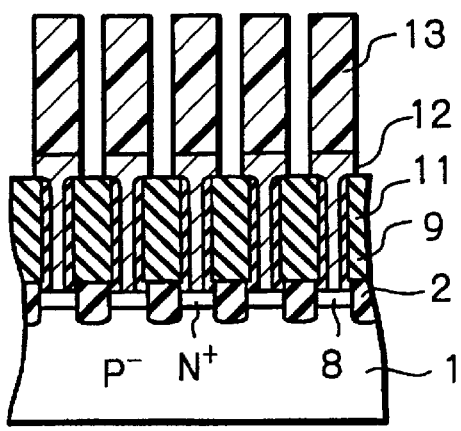
Figure 29C:
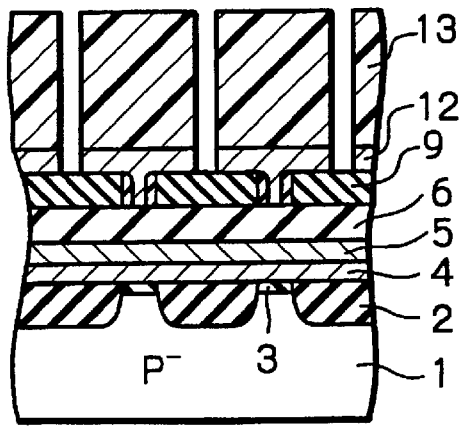

Next, referring to FIGS. 29A, 29B and 29C, in the same way as in FIGS. 12A, 12B and 12C, the polycrystalline silicon layer 12 is etched by a dry or wet etching process using the photoresist pattern 13 as a mask. As a result, the polycrystalline silicon layer 12 becomes the pad polycrystalline silicon electrodes. Then, the photoresist pattern 13 is removed.

Figure 30:
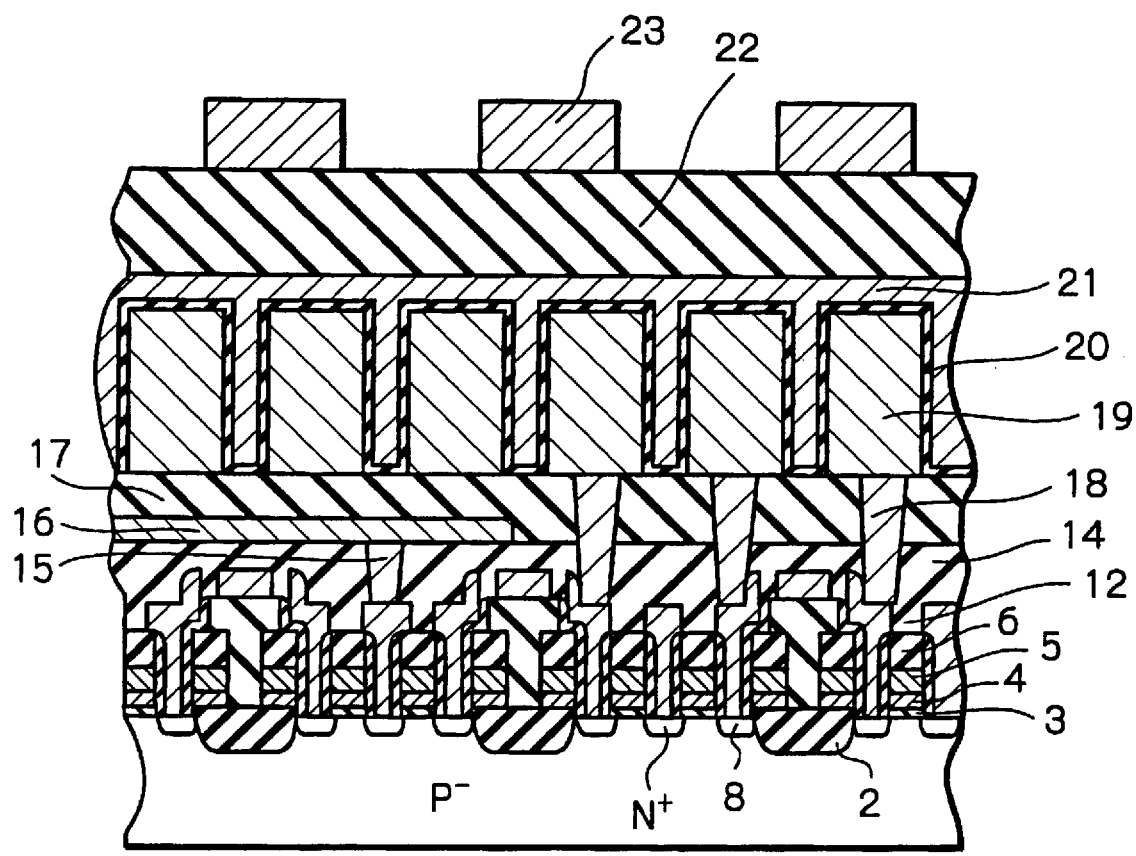

Finally, referring to FIG. 30, in the same way as in FIG. 13, an insulating layer 14 is formed on the entire surface, and a bit contact layer 15 is buried in the insulating layer 14. Also, a bit line layer 16 is formed on the insulating 14 and is connected to the bit contact layer 15.

Then, after an insulating layer 17 is formed on the entire surface, and a capacitance contact layer 18 is buried in the insulating layer 17.

Then, a lower capacitor electrode 19, a capacitor insulating layer 20 and an upper capacitor electrode 21 are formed.

Then, an insulating layer 22 is formed on the entire surface, and an aluminum layer 23 is formed on the insulating layer 22, thus completing the DRAM device.

In the above-described first embodiment, the photoresist pattern 10' has one opening OP (see FIG. 31) for each field pattern, i.e., active area. That is, the opening OP of FIG. 31 is larger than the openings $OP_1$, $OP_2$ and $OP_3$ of FIG. 16, so that the margin of the opening OP of FIG. 31 can be larger than that of the openings $OP_1$, $OP_2$ and $OP_3$ of FIG. 16. As a result, since the width W' of the opening OP can be larger than the width W of the openings $OP_1$, $OP_2$ and $OP_3$ which makes the photolithography process easily, the side etching of the field silicon oxide layer 2 can be avoided, thus suppressing the deterioration of the isolation properties thereof. Also, since the margin of the opening OP can be increased, the size of the pad polycrystalline silicon electrodes can be increased to decrease the contact resistance between the pad polycrystalline silicon electrodes and the impurity diffusion regions 8.

A second embodiment of the method for manufacturing a DRAM device according to the present invention will be explained with reference to FIGS. 32A, 32B, 32C, 32D, 33A, 33B, 33C, 33D, 34A, 34B, 34C, 34D, 35A, 35B, 35C, 35D, 36A, 36B, 36C, 36D, 37A, 37B, 37C, 37D, 38A, 38B, 38C, 38D, 39A, 39B, 39C, 39D, 40A, 40B, 40C, 40D, 41A, 41B, 41C, 41D, 42A, 42B, 42C, 42D, 43, 44, 45 and 46.

Figure 44:
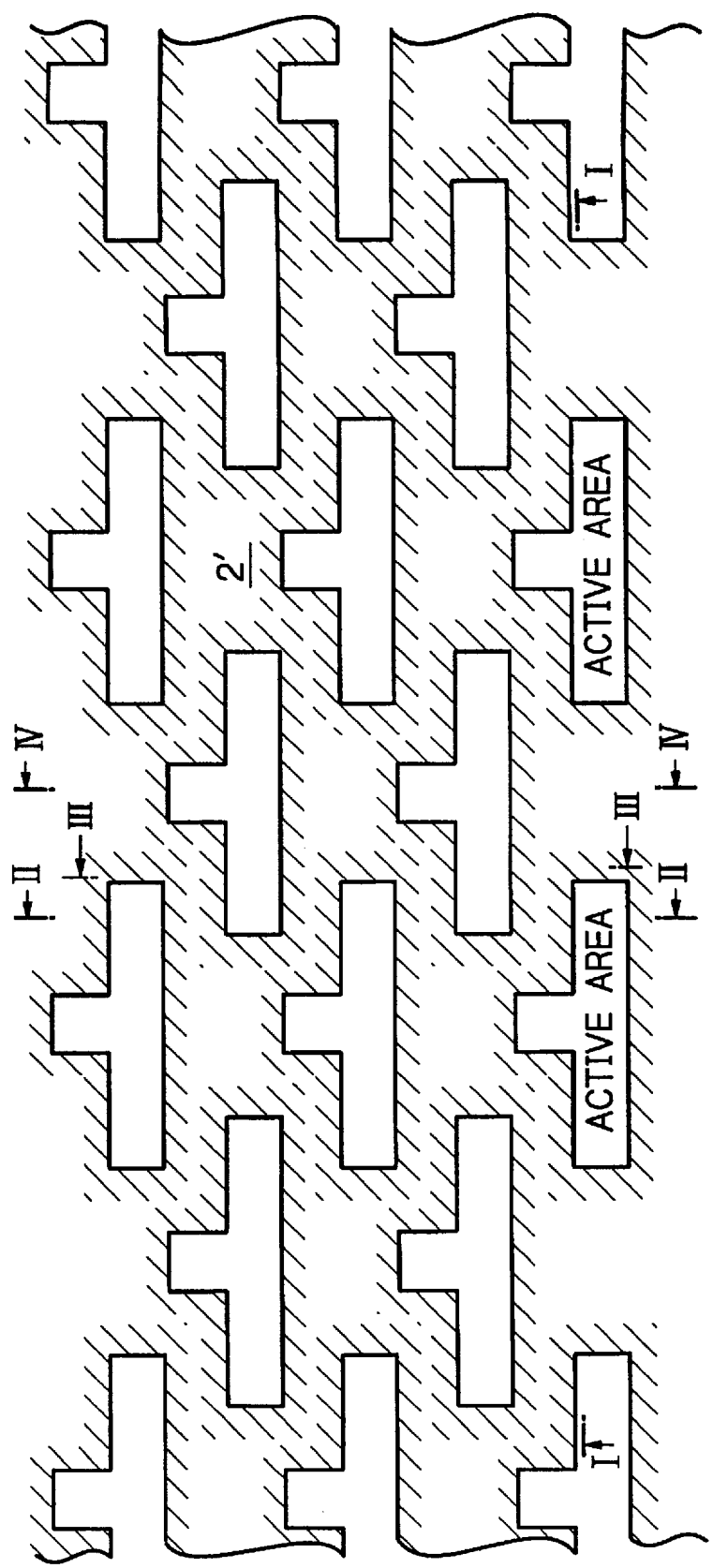
FIG. 44 is a plan view of the field silicon oxide layer of FIGS. 32A, 32B, 32C and 32D.

First, referring to FIGS. 32A, 32B, 32C and 32D, in a similar way to that of FIGS. 1A, 1B and 1C, a field silicon oxide layer 2' as illustrated in FIG. 44 is formed on a P-type monocrystalline silicon substrate 1 by an STI process. The field silicon oxide layer 2' has a plurality of convex-type field patterns corresponding to convex-type active areas.

Note that FIGS. 32A, 32B, 32C and 32D are cross-sectional views taken along the lines I—I, II—II, III—III and IV—IV, respectively, of FIG. 44 which is a plan view of the field silicon oxide layer 2'.

Next, referring to FIGS. 33A, 33B, 33C and 33D, in the same way as in FIGS. 2A, 2B and 2C, a gate silicon oxide layer 3 is thermally grown on the silicon substrate 1. Then, an about 100 nm thick lower gate electrode layer 4 made of polycrystalline silicon and an about 150 nm thick upper gate electrode layer 5 made of silicon silicide such as WSi are deposited by a CVD process or a sputtering process. Then, an about 150 nm thick silicon nitride layer 6 serving as an etching stopper is deposited on the upper gate electrode 5 by a CVD process.

Figure 45:
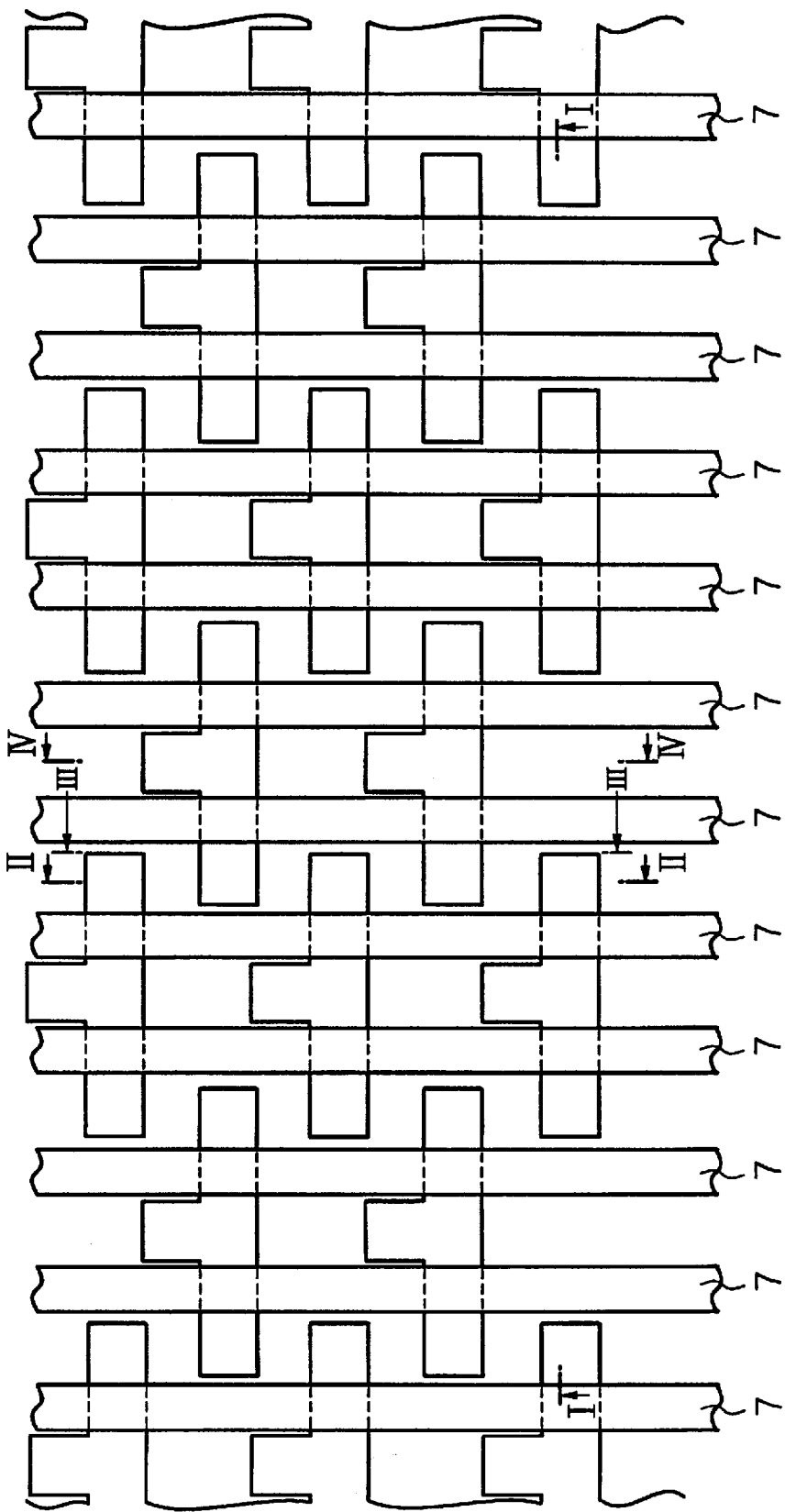
FIG. 45 is a plan view of the photoresist pattern of FIGS. 34A, 34B, 34C and 34D.

Next, referring to FIGS. 34A, 34B, 34C and 34D, in the same way as in FIGS. 3A, 3B and 3C, a photoresist pattern 7 as illustrated in FIG. 45 is formed by a photolithography process. Then, the silicon nitride layer 6 is etched by using the photoresist pattern 7 as a mask. Then, the upper gate electrode layer 5 and the lower gate electrode layer 4 are further etched by using the photoresist pattern 7 as a mask. Then, the photoresist pattern 7 is removed.

Note that FIGS. 34A, 34B, 34C and 34D are cross-sectional views taken along the lines I—I, II—II, III—III and IV—IV, respectively, of FIG. 45 which is a plan view of the photoresist pattern 7.

Also, in FIGS. 34A, 34B, 34C and 34D, the upper gate electrode layer 5 and the lower gate electrode layer 4 are etched by using the photoresist pattern 7 as a mask; however, the upper gate electrode layer 5 and the lower gate electrode layer 4 can be etched by using the silicon nitride layer 6 as a mask. In this case, after the silicon nitride layer 6 is etched, the photoresist pattern 7 is removed.

Figure 4A:
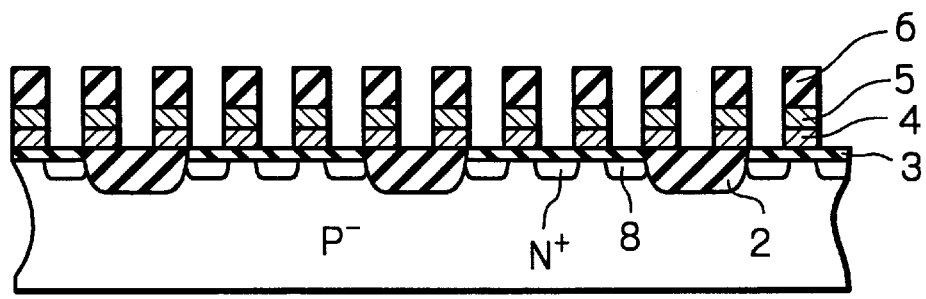
Figure 4B:
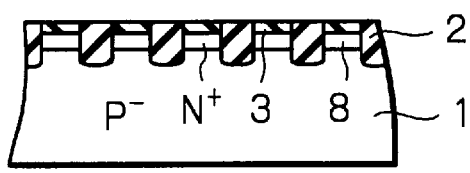
Figure 4C:
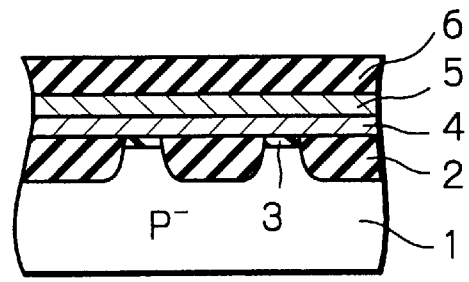

Next, referring to FIGS. 35A, 35B, 35C and 35D, in the same way as in FIGS. 4A, 4B and 4C, N-type impurities such as arsenic are implanted into the silicon substrate I by using the silicon nitride layer 6 as a mask to form $N^+$-type impurity diffusion regions 8.

Next, referring to FIGS. 36A, 36B, 36C and 36D, in the same way as in FIGS. 5A, 5B and 5C, an insulating layer 9 made of silicon oxide or BPSG is formed on the entire surface by a CVD process.

Figure 46:
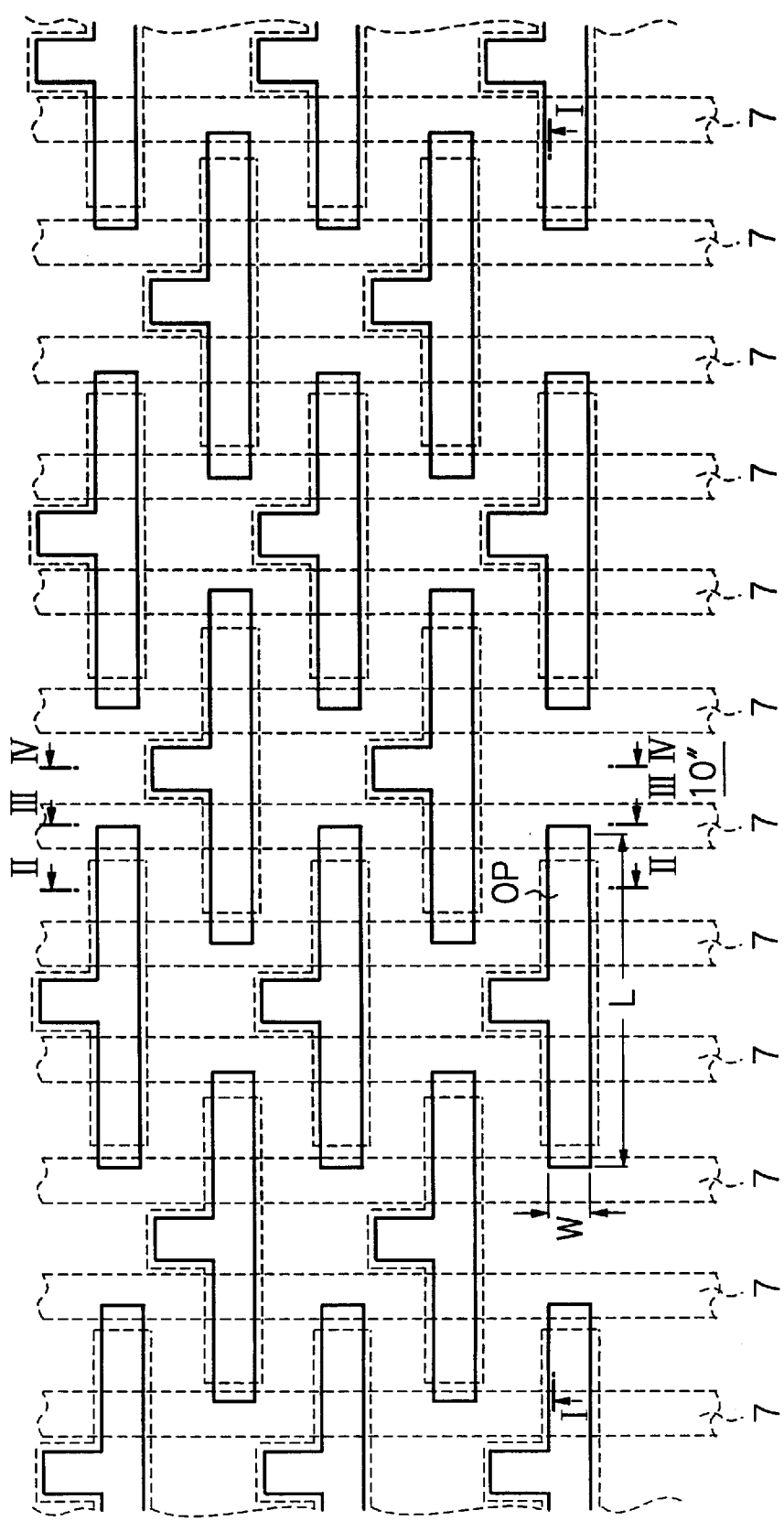
FIG. 46 is a plan view of the photoresist pattern of FIGS. 37A, 37B, 37C and 37D.

Next, referring to FIGS. 37A, 37B, 37C and 37D, in a similar way to that of FIGS. 23A, 23B and 23C, a photoresist pattern 10" as illustrated in FIG. 46 is formed by a photolithography process. Note that the photoresist pattern 10" has a plurality of convex-type holes view; opening up each corresponding to one field pattern, i.e., active area.

Next, referring to FIGS. 38A, 38B, 38C and 38D, in the same way as in FIGS. 7A, 7B and 7C, the insulating layer 9 is etched by a dry or wet etching process using the photoresist pattern 10" as a mask. In this case, the silicon nitride layer 6 serves as an etching stopper. Then, the photoresist pattern 10" is removed.

Next, referring to FIGS. 39A, 39B, 39C and 39D, in the same way as in FIGS. 8A, 8B and 8C, an insulating layer 11 made of silicon oxide or silicon nitride is deposited on the entire surface.

Next, referring to FIGS. 40A, 40B, 40C and 40D, in the same way as in FIGS. 9A, 9B and 9C, the insulating layer 11 is etched back, so that the insulating layer 11 is left only on the sidewalls of the insulating layer 9.

Next, referring to FIGS. 41A, 41B, 41C and 41D, in the same way as in FIGS. 10A, 10B and 10C, a polycrystalline silicon layer 12 is deposited on the entire surface by a CVD process.

Next, referring to FIGS. 42A, 42B, 42C and 42D, the polycrystalline silicon layer 12 is etched back. As a result, the polycrystalline silicon layer 12 becomes the pad polycrystalline silicon electrodes.

Figure 43:
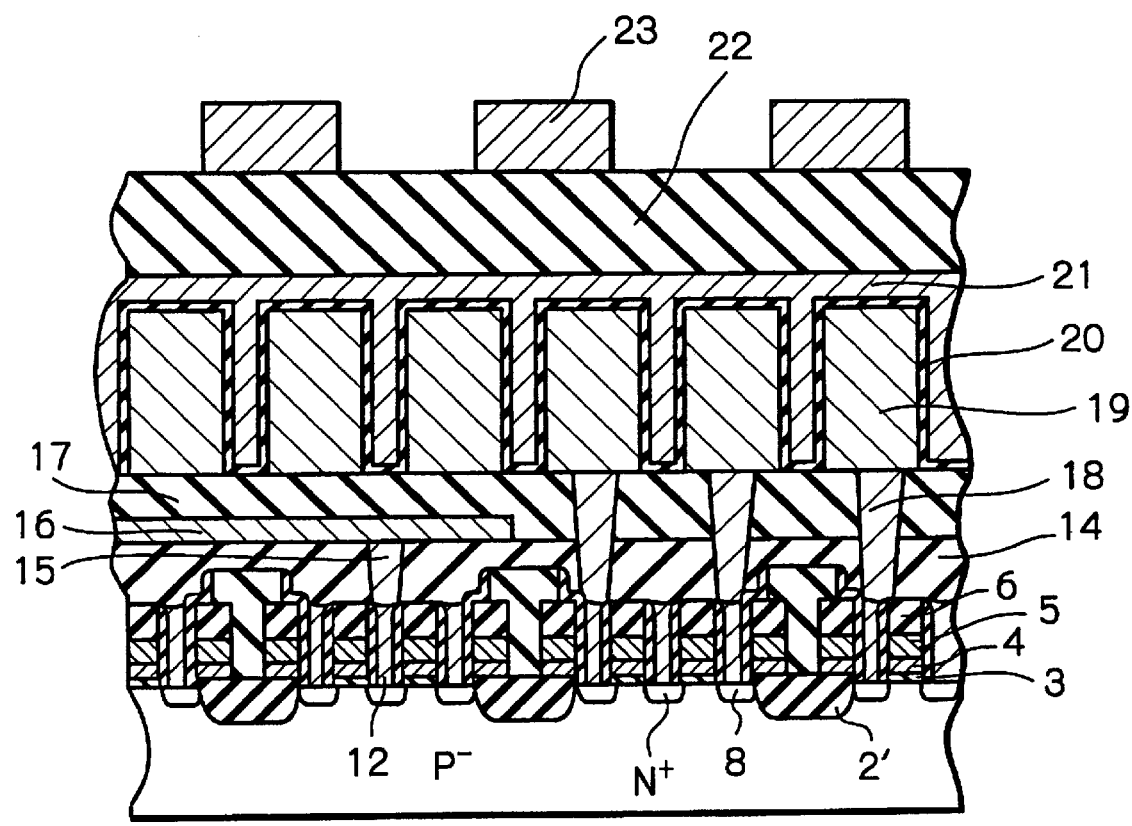

Finally, referring to FIG. 43, in the same way as in FIG. 13, an insulating layer 14 is formed on the entire surface, and a bit contact layer 15 is buried in the insulating layer 14. In this case, the bit contact layer 15 is connected to the convex portion of the pad polycrystalline silicon layer 12. Also, a bit line layer 16 is formed on the insulating 14 and is connected to the bit contact layer 15.

Then, after an insulating layer 17 is formed on the entire surface, and a capacitance contact layer 18 is buried in the insulating layer 17.

Then, a lower capacitor electrode 19, a capacitor insulating layer 20 and an upper capacitor electrode 21 are formed.

Then, an insulating layer 22 is formed on the entire surface, and an aluminum layer 23 is formed on the insulating layer 22, thus completing the DRAM device.

Even in the above-described second embodiment, the photoresist pattern 10" has one opening OP (see FIG. 46) for each field pattern, i.e., active area. Therefore, since the photolithography process can be easily carried out, the side etching of the field silicon oxide layer 2' can be avoided, thus suppressing the deterioration of the isolation properties thereof. Also, since the margin of the opening OP can be increased, the size of the pad polycrystalline silicon electrodes can be increased to decrease the contact resistance between the pad polycrystalline silicon electrodes and the impurity diffusion regions 8.

In addition, in the second embodiment, since the back etching step as illustrated in FIGS. 42A, 42B, 42C and 42D is provided instead of the photolithography and etching step as illustrated in FIGS. 29A, 29B, 29C, 29D, 30A, 30B, 30C and 30D of the first embodiment, the manufacturing steps can be further simplified which would decrease the manufacturing cost.

As explained hereinabove, according to the present invention, since one opening corresponding to one field pattern (i.e., active area) is perforated in a photoresist layer for forming contact holes, the photolithography process can be easily carried out, which can suppress the deterioration of the isolation characteristics of the field insulating layer. Also, since the size of the pad electrodes can be increased, the contact resistance thereof can be decreased. Further, since the number of photolithography and etching steps is decreased, the manufacturing cost can be decreased.

What is claimed is:

1. A method for manufacturing a semiconductor memory device, wherein a plurality of openings are perforated in an insulating layer formed on first impurity diffusion regions for bit lines and second impurity diffusion regions for capacitors of a semiconductor substrate surrounded by a field insulating layer, each of said openings corresponding to one of said first impurity diffusion regions and at least two of said second impurity diffusion regions.

2. A method for manufacturing a semiconductor memory device, comprising the steps of:

forming a field insulating layer defining a plurality of active areas on a semiconductor substrate;

forming gate electrodes on said field insulating layer and the active areas of said semiconductor substrate;

forming an insulating layer on said gate electrodes;

perforating a plurality of openings in said insulating layer, each of said openings corresponding to one of said active areas;

forming sidewall insulating layers on sidewalls of said gate electrodes and said insulating layer after said openings are perforated; and burying first conductive layers among said gate electrodes after said sidewall insulating layers are formed.

3. The method as set forth in claim 2, wherein said conductive layer burying step comprises the steps of:

forming a second conductive layer on said sidewall insulating layers;

forming a photoresist pattern layer having patterns each corresponding to one impurity diffusion region in said semiconductor substrate; and etching said second conductive layer by using said photoresist pattern layer as a mask to form said first conductive layers.

4. The method as set forth in claim 3, wherein each of said openings is rectangular.

5. The method as set forth in claim 2, wherein said conductive layer burying step comprises the steps of:

forming a second conductive layer on said sidewall insulating layers; and etching back said second conductive layer to form said first conductive layers.

6. The method as set forth in claim 5, wherein each of said openings is concave.

7. The method as set forth in claim 6, wherein a concave portion of each of said openings corresponds to one impurity diffusion region for a bit line in said semiconductor substrate.

8. The method as set forth in claim 2, wherein said field insulating layer is formed by using a shallow trench isolation process.

9. A method for manufacturing a semiconductor memory device, comprising the steps of:

forming a field insulating layer defining rectangular active areas in plan view with a longer side along a first direction on a semiconductor substrate of a first conductivity type;

forming a gate insulating layer on said semiconductor substrate after said field insulating layer is formed;

forming gate electrodes on said field insulating layer and said gate insulating layer along a second direction perpendicular to said first direction, two of said gate electrodes crossing over one of the active areas of said semiconductor substrate;

introducing impurity ions of a second conductivity type opposite to said first conductivity type in self-alignment with said gate electrodes to form impurity diffusion regions in the active areas of said semiconductor substrate;

forming an insulating layer on said impurity diffusion regions;

perforating a plurality of rectangular openings in said insulating layer, each of said rectangular openings corresponding to one of the active areas of said semiconductor substrate;

forming sidewalls insulating layers on sidewalls of said gate electrodes and said insulating layer after said rectangular openings are perforated;

forming a conductive layer on said sidewall insulating layers;

forming a photoresist pattern layer having patterns each corresponding to one of said impurity diffusion regions; and etching said conductive layer by using said photoresist pattern layer as a mask.

10. The method as set forth in claim 9, wherein said field insulating layer is formed by using a shallow trench isolation process.

11. A method for manufacturing a semiconductor memory device, comprising the steps of:

forming a field insulating layer defining concave active areas in plan view with a longer side along a first direction on a semiconductor substrate of a first conductivity type;

forming a gate insulating layer on said semiconductor substrate after said field insulating layer is formed;

forming gate electrodes on said field insulating layer and said gate insulating layer along a second direction perpendicular to said first direction, two of said gate electrodes crossing over one of the active areas of said semiconductor substrate;

introducing impurity ions of a second conductivity type opposite to said first conductivity type in self-alignment with said gate electrodes to form impurity diffusion regions in the active areas of said semiconductor substrate;

forming an insulating layer on said impurity diffusion regions;

perforating a plurality of concave openings in said insulating layer, each of said concave openings corresponding to one of the active areas of said semiconductor substrate;

forming sidewalls insulating layers on sidewalls of said gate electrodes and said insulating layer after said concave openings are perforated;

forming a conductive layer on said sidewall insulating layers; and etching back said conductive layer.

12. The method as set forth in claim 11, wherein said field insulating layer is formed by using a shallow trench isolation process.

* * * * *